(12) United States Patent
Razaghi et al.

(10) Patent No.: US 9,674,782 B2
(45) Date of Patent: Jun. 6, 2017

(54) REDUCING BATTERY CONSUMPTION AT A USER EQUIPMENT

(71) Applicant: QUALCOMM Incorporated, San Diego, CA (US)

(72) Inventors: Peyman Razaghi, San Diego, CA (US); Sony Akkarakaran, Poway, CA (US); Sharad Deepak Sambhwani, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 231 days.

(21) Appl. No.: 14/569,369

(22) Filed: Dec. 12, 2014

(65) Prior Publication Data

US 2015/0312855 A1 Oct. 29, 2015

Related U.S. Application Data

(60) Provisional application No. 61/985,922, filed on Apr. 29, 2014.

(51) Int. Cl.
*H04W 52/02* (2009.01)
*H04W 76/00* (2009.01)
*H03M 7/30* (2006.01)
*H04W 28/06* (2009.01)

(52) U.S. Cl.
CPC ..... *H04W 52/0216* (2013.01); *H04W 52/028* (2013.01); *H04W 76/00* (2013.01); *H03M 7/30* (2013.01); *H04W 28/06* (2013.01); *Y02B 60/50* (2013.01)

(58) Field of Classification Search
CPC ......... H04W 52/0216; H04W 72/0413; H04W 76/00; H04W 52/028
See application file for complete search history.

(56) References Cited

U.S. PATENT DOCUMENTS

| 2008/0151797 A1* | 6/2008 | Camp | H04W 52/0274 370/311 |
| 2015/0124671 A1* | 5/2015 | Tabet | H04W 52/0216 370/311 |
| 2015/0358135 A1* | 12/2015 | Wang | H03M 13/6525 370/336 |

OTHER PUBLICATIONS

International Search Report and Written Opinion issued in International Patent Application No. PCT/US2015/027279 dated Jul. 27, 2015 (pp. 1-5).

(Continued)

*Primary Examiner* — Omer S Mian
(74) *Attorney, Agent, or Firm* — Darren M. Simon

(57) ABSTRACT

The present disclosure presents a method and an apparatus for reducing battery consumption at a user equipment (UE). For example, the method may include configuring a 10 ms transmission mode on an uplink (UL) channel at the UE, indicating configuration of the 10 ms transmission mode to a base station in communication with the UE, compressing a 20 ms transmission associated with a 20 ms transmission time interval (TTI) into a 10 ms compressed transmission, transmitting the 10 ms compressed transmission during a first 10 ms of the 20 ms TTI, and performing a discontinuous transmission (DTX) of the UL channel during a second 10 ms of the 20 ms TTI. As such, reduced battery consumption at a UE may be achieved.

24 Claims, 14 Drawing Sheets

(56) References Cited

OTHER PUBLICATIONS

Qualcomm Incorporated: "TP on Section 5.1 on Uplink Physical Layer Enhancements", 3GPP Draft; R1-132699, 3rd Generation Partnership Project (3GPP), Mobile Competence Centre; 650, Route Des Lucioles; F-06921 Sophia-Antipolis Cedex; France , vol. RAN WG1, No. Fukuoka; May 20, 2013-May 24, 2013, pp. 1-12, May 29, 2013, XP050698549, Retrieved from the Internet: URL:http://www.3gpp.org/ftp/tsg_ran/WG1_RL1/TSGR1_73/Docs/ [retrieved on May 29, 2013].

ZTE: "Uplink Time Division Multiplexing Using Reduced Spreading Factor", 3GPP Draft; R1-131130 DCH ENH UL TDM Using Reduced SF, 3rd Generation Partnership Project (3GPP), Mobile Competence Centre; 650, Route Des Lucioles; F-06921 Sophia-Anitpolis Cedex; France vol. RAN WG1, No. Chicago, Illinois, USA; Apr. 15, 2013-Apr. 19, 2013, Apr. 5, 2013, pp. 1-10, XP050696759, Retrieved from the Internet: URL: http://www.3gpp.org/ftp/tsg_ran/WG1_RL1/TSGR1_72b/Docs/ [retrieved on Apr. 5, 2013] paragraph [0002]-paragraph [0005].

\* cited by examiner

REDUCING BATTERY CONSUMPTION AT A USER EQUIPMENT

CLAIM OF PRIORITY

The present application for patent claims priority to U.S. Provisional Patent Application No. 61/985,922, filed Apr. 29, 2014, entitled "Mechanisms and Apparatus for Battery-Efficient Operation of DCH Channel," which is assigned to the assignee hereof, and hereby expressly incorporated by reference herein.

BACKGROUND

Aspects of the present disclosure relate generally to wireless communication systems, and more particularly, to reducing battery consumption at a user equipment (UE).

Wireless communication networks are widely deployed to provide various communication services such as telephony, video, data, messaging, broadcasts, and so on. Such networks, which are usually multiple access networks, support communications for multiple users by sharing the available network resources. One example of such a network is the UMTS Terrestrial Radio Access Network (UTRAN). The UTRAN is the radio access network (RAN) defined as a part of the Universal Mobile Telecommunications System (UMTS), a third generation (3G) mobile phone technology supported by the 3rd Generation Partnership Project (3GPP). The UMTS, which is the successor to Global System for Mobile Communications (GSM) technologies, currently supports various air interface standards, such as Wideband-Code Division Multiple Access (W-CDMA), Time Division-Code Division Multiple Access (TD-CDMA), and Time Division-Synchronous Code Division Multiple Access (TD-SCDMA). The UMTS also supports enhanced 3G data communications protocols, such as High Speed Packet Access (HSPA), which provides higher data transfer speeds and capacity to associated UMTS networks.

Circuit-switched W-CDMA voice communications are performed over a dedicated channel (DCH). The DCH for voice is comprised of two logical channels, a dedicated traffic channel (DTCH) with a 20 ms transmission time interval (TTI) and a dedicated control channel (DCCH) with a 40 ms TTI. A dedicated physical control channel (DPCCH) carries control information generated at the physical layer, e.g., pilot, power control, and rate bits. The operation of these channels consumes battery power at a user equipment (UE), thereby reducing the time the UE can operate on battery power.

Thus, there is a desire for reducing battery consumption at the UE during operation of these channels.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

The present disclosure presents an example method and apparatus for reducing battery consumption at a user equipment (UE). For example, the present disclosure presents an example method for configuring a 10 ms transmission mode on an uplink (UL) channel at the UE, indicating configuration of the 10 ms transmission mode to a base station in communication with the UE, compressing a 20 ms transmission associated with a 20 ms transmission time interval (TTI) into a 10 ms compressed transmission, transmitting the 10 ms compressed transmission during a first 10 ms of the 20 ms TTI, and performing a discontinuous transmission (DTX) of the UL channel during a second 10 ms of the 20 ms TTI.

Additionally, the present disclosure presents an example apparatus for reducing battery consumption at a user equipment (UE) that may include means for configuring a 10 ms transmission mode on an uplink (UL) channel at the UE, means for indicating configuration of the 10 ms transmission mode to a base station in communication with the UE, means for compressing a 20 ms transmission associated with a 20 ms transmission time interval (TTI) into a 10 ms compressed transmission, means for transmitting the 10 ms compressed transmission during a first 10 ms of the 20 ms TTI, and means for performing a discontinuous transmission (DTX) of the UL channel during a second 10 ms of the 20 ms TTI In a further aspect, the presents disclosure presents an example non-transitory computer readable medium storing computer executable code for reducing battery consumption at a user equipment (UE) that may include code for configuring a 10 ms transmission mode on an uplink (UL) channel at the UE, code for indicating configuration of the 10 ms transmission mode to a base station in communication with the UE, code for compressing a 20 ms transmission associated with a 20 ms transmission time interval (TTI) into a 10 ms compressed transmission, code for transmitting the 10 ms compressed transmission during a first 10 ms of the 20 ms TTI, and code for performing a discontinuous transmission (DTX) of the UL channel during a second 10 ms of the 20 ms TTI.

Furthermore, in an aspect, the present disclosure presents an example apparatus for reducing battery consumption at a user equipment (UE) that may include a transmission mode configuring component to configure a 10 ms transmission mode on an uplink (UL) channel at the UE, a transmission mode indicating component to indicate configuration of the 10 ms transmission mode to a base station in communication with the UE, a compression component to compress a 20 ms transmission associated with a 20 ms transmission time interval (TTI) into a 10 ms compressed transmission, a transmission component to transmit the 10 ms compressed transmission during a first 10 ms of the 20 ms TTI, and a discontinuous transmission (DTX) component to perform a discontinuous transmission (DTX) of the UL channel during a second 10 ms of the 20 ms TTI.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

The present disclosure provides a method and apparatus for reducing battery consumption at a user equipment (UE) during operation of a dedicated channel (DCH) by configuring a 10 ms transmission mode on an uplink (UL) at the UE, indicating configuration of the 10 ms transmission mode to a base station in communication with the UE, compressing a 20 ms transmission associated with a 20 ms transmission time interval (TTI) into a 10 ms compressed transmission, transmitting the 10 ms compressed transmission during a first 10 ms of the 20 ms TTI, and performing a discontinuous transmission (DTX) of the UL channel during a second 10 ms of the 20 ms TTI.

Figure 1:
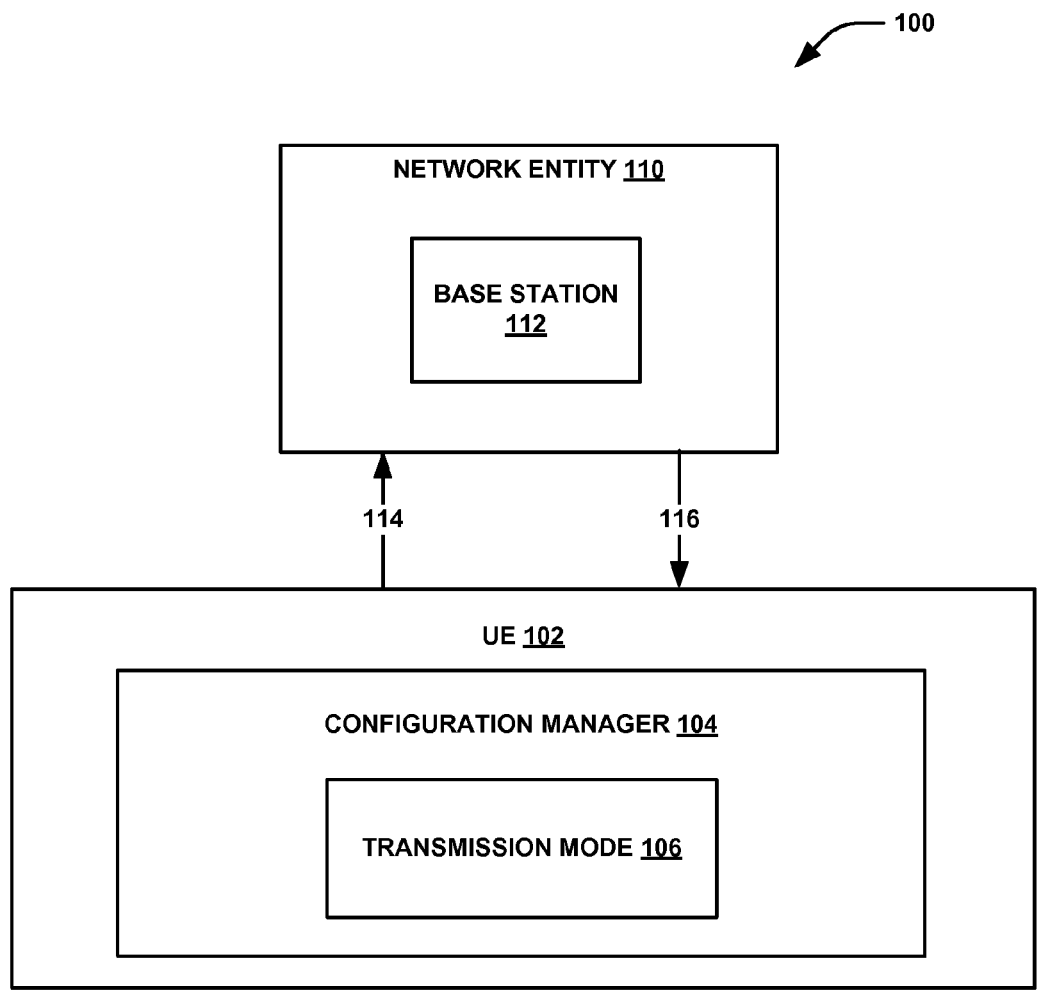
FIG. 1 is a block diagram illustrating an example wireless system in aspects of the present disclosure.

Referring to FIG. 1, a wireless communication system 100 is illustrated that facilitates reducing battery consumption at a user equipment (UE). For example, system 100 includes a UE 102 that may communicate with a network entity 110 and/or base station via one or more over-the-air links 114 and/or 116. For example, UE 102 may communicate with base station 112 on an uplink (UL) 114 and/or a downlink (DL) 116. The UL 114 is generally used for communication from UE 102 to base station 112 and/or the DL 116 is generally used for communication from base station 112 to UE 102.

In an aspect, network entity 110 may include one or more of any type of network components, for example, an access point, including a base station (BS) or Node B or eNode B or a femto cell, a relay, a peer-to-peer device, an authentication, authorization and accounting (AAA) server, a mobile switching center (MSC), a radio network controller (RNC), etc., that can enable UE 102 to communicate and/or establish and maintain wireless communication links 114 and/or 116, which may include a communication session over a frequency or a band of frequencies that form a communication channel, to communicate with network entity 110 and/or base station 112. In an additional aspect, for example, base station 112 may operate according to a radio access technology (RAT) standard, e.g., GSM, CDMA, W-CDMA, HSPA or a long term evolution (LTE).

In an additional aspect, UE 102 may be a mobile apparatus and may also be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a terminal, a user agent, a mobile client, a client, or some other suitable terminology.

In an aspect, UE 102 may be configured to include a configuration manager 104 to configure a transmission mode 106 of an uplink (UL) channel at the UE. For example, in an aspect, configuration manager 104 may configure the transmission mode of a UL channel (e.g., dedicated physical control channel (DPCCH)) in a 10 ms transmission mode or a 20 ms transmission mode, where the value 10 ms or 20 ms indicates a duration of a transmission for the respective mode. In the present disclosure, the terms uplink (UL) and UL channel may be used interchangeably, and in an aspect, the UL or the UL channel may include, but is not limited to, an UL DPCCH. The UE uses the configured transmission mode for transmitting data on the UL (e.g., link 114) from UE 102 to network entity 110 and/or base station 112. In an aspect, the UL channel used for transmission in the 10 ms or 20 ms transmission mode may be a UL DPCCH that carries control information, e.g., pilot, power control, and rate bits, generated at the physical layer.

In an aspect, when configuration manager 104 configures UE 102 to operate in the 10 ms transmission mode, UE 102 may compress a 20 ms transmission associated with a 20 ms transmission time interval (TTI) into a 10 ms compressed transmission, and transmit the compressed transmission during a first 10 ms of the 20 ms TTI. Further, the UE may perform a discontinuous transmission (DTX) of the UL channel during a second 10 ms of the 20 ms TTI In an additional or optional aspect, configuration manager 104 may configure UE 102 to receive a downlink (DL) dedicated physical channel (DPCH) during the whole duration of the 20 ms TTI or only during the first 10 ms of the 20 ms TTI. In a further additional aspect, configuration manager may configure UE 102 to suspend transmission of TPC commands to the base station during the second 10 ms of the 20 ms TTI as the UE may be in a discontinuous transmission (DTX) mode during the second 10 ms of the 20 ms TTI.

Additional aspects, which may be performed in combination with the above aspects or independently thereto, are discussed below and may lead to further battery-efficient operation of UE 102.

Figure 2:
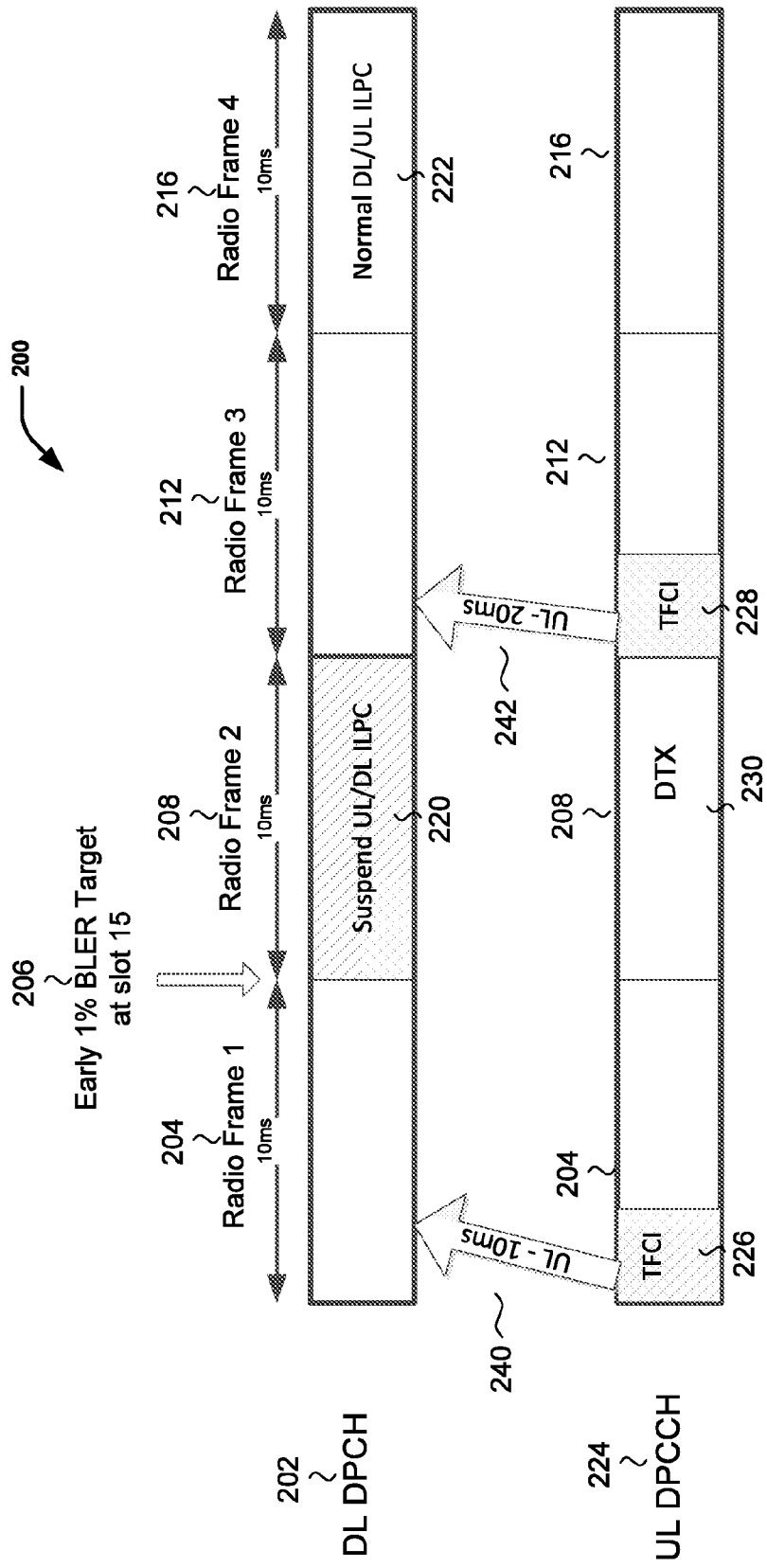
FIGS. 2-7 are block diagrams of uplink and downlink frames over time, illustrating various example aspects of the present disclosure.

FIG. 2 illustrates an example aspect of a frame structure 200 of radio frames for downlink channel 202 and uplink channel 224 associated with UE 102 operating in a 10 ms transmission mode with an early block error rate (BLER) target of 1% at slot 15, always-on DL DPCH, and suspended inner loop power control (ILPC), in a DL frame early termination-less (FET-less) operation of a dedicated channel (DCH).

In an aspect, configuration manager 104 may configure UE 102 to operate in a 10 ms transmission mode 240 during transmission of a first voice frame (e.g., a 20 ms voice frame) that includes a first 10 ms radio frame 204 (e.g., radio frame 1) and a second 10 ms radio frame 208 (e.g., radio frame 2) on UL to base station 112. UE 102 may indicate (e.g., notify) the configured transmission mode 240 to base station 112 by transmitting a transport format combination indicator (TFCI) 226 in the first 10 ms radio frame 204 on UL DPCCH 224. In wireless networks, TFCI 226 may be used to indicate or inform the receiving side (e.g., base station 112) of the current transport format combination (TFC) and how to decode, de-multiplex, and deliver the received data on the appropriate transport channels.

For example, in an aspect, a most significant bit (MSB) of TFCI 226 may be set to a value of 1 to indicate the UE is configured for transmission in the 10 ms transmission mode. In an additional or optional aspect, the MSB of TFCI may be set to a value of 0 (at 228) to indicate the UE is configured for transmission in the 20 ms transmission mode 242, e.g., for transmitting a second voice frame (e.g., a 20 ms voice frame) that includes radio frame 3 (212) and radio frame 4 (216). In a further additional or optional aspect, two different blocks of TFCI values may be used to identify the two different transmission modes (e.g., 10 ms and 20 ms transmission modes).

In an additional aspect, TFCI values may be sent using a shorter code over the first few slots, e.g., using the first 10 slots and a punctured code obtained by puncturing the R99 TFCI encoder. This may give base station 112 sufficient time to decode the TFCI values and identify whether the UE is in a 10 ms transmission mode or in a 20 ms transmission mode. In an optional aspect, dedicated physical control channel (DPCCH) of R99 may be used, and base station 112 may only collect the information about TFCI values over the first, e.g., 10, slots to decode the TFCI values early.

In an aspect, UE 102 may dynamically switch between the 10 ms transmission mode 240 and the 20 ms transmission mode 242 based on a UE metric. For example, UE 102 may dynamically switch from 20 ms transmission mode 242 to the 10 ms transmission mode 240 based on available UE power headroom. UE power headroom is generally defined as transmission power left for the UE to use in addition to the power being used by the current transmission. Once the UE switches from the 20 ms transmission mode to the 10 ms transmission mode, UE 102 may indicate the current transmission mode (e.g., 10 ms transmission mode) to the base station using TFCI values configured at the UE (e.g., 226), as described above.

In an aspect, when UE 102 is configured to operate in the 10 ms transmission mode 240, UE 102 compresses the 20 ms transmission associated with a 20 ms transmission time interval (TTI) into one 10 ms compressed transmission and transmits the compressed radio frame during the duration of the first 10 ms of the 20 ms TTI. This allows the UE to enter a discontinuous transmission (DTX) mode 230 during the second 10 ms of the 20 ms TTI to reduce battery consumption at the UE. DTX mode 230 generally allows a UE to suspend or stop transmission of a channel where there are no packets for transmission on the channel to conserve battery power.

In an aspect, when the UE 102 transmits the compressed transmission during the first 10 ms of the 20 ms TTI and enters the DTX mode 230 during the second 10 ms of the 20 ms TTI, network entity 110 and/or base station 112 may configure an early block error rate (BLER) target 206 at the base station 112 to enable the base station 112 to complete transmission on the DL earlier than normal (e.g., prior to the completion of the second 10 ms of the 20 ms TTI) so that the UE 102 can maximize savings by entering a discontinuous reception (DRX) mode on the DL at the UE.

The BLER is generally defined as the ratio of the number of erroneous blocks received (e.g., at base station 112) to the total number of blocks sent (e.g., from UE 102). An erroneous block is defined as a transport block for which the cyclic redundancy check (CRC) failed. The early BLER target 206 as described herein allows increasing or maximizing battery savings at the UE 102 by enabling DRX operation. For example, the early DL BLER target 206 may be shape the DL decoding time and may force the UE 102 to decode the DL radio frame earlier in the TTI. For instance, in an aspect, the value of the early BLER target 206 may configured to e.g., 1%, which is the typical value used in R99 DCH communications, a higher value, or a residual BLER constraint of 1% for the overall link performance, or a combination of these.

For example, when the early BLER target 206 is configured for 1% at slot 15, the UE 102 may perform one decoding attempt at the early BLER target slot (e.g., slot 15) and adjust its DL DPCH set point through outer loop power control (OLPC) mechanism to ensure that the DL DPCH decoding success rate meets the 1% BLER target set at slot 15. The OLPC mechanism is generally used to maintain the quality of communication at the level of a bearer service quality requirement, while using as lower amount of power as possible.

In an additional example, when the early BLER target 206 is configured to a value higher than 1%, the UE may have to perform two decoding attempts, one at the early target slot (e.g., slot 15), and if not successful, another decoding attempt after one full TTI equivalent of DPCH packets are received (e.g., 20 ms for DTCH, 40 ms for DCCH+DTCH). Additionally, the UE 102 may use joint coding of classes A, B, and C bits and cyclic redundancy check (CRC) to test whether the first decoding attempt succeeds or not. Further, the UE 102 may adjust its OLPC set point for DL DPCH so that the decoding success rate for DL DPCH at the slot for the early BLER target 206 meets the value of the early BLER target 206. The UE 102 may also keep track of overall BLER statistics of the packet, including DL DPCH frames that fail at the early decoding attempt, and may use a secondary decoding attempt at the end of the TTI. Furthermore, the UE 102 may adjust the OLPC set point in such a way that the overall BLER statistics meet the overall BLER target value.

In an aspect, in the DL frame early termination-less (FET-less) operation (or without FET), the TTI values and physical channel procedures, e.g., rate matching, multiplexing, interleaving need not be different from R99 procedures. FET is generally defined as enabling a UE 102 (or base station 112) to not have to transmit an entire frame if the UE 102 (or the base station 112) has already successfully decoded the information and sent an acknowledgement (ACK) receipt. Additionally, mechanisms like joint coding of class A, B, and C adaptive multi-rate (AMR) codec bits may still be used to allow early decoding of DL DPCH before the early target slot. Further, the same DL DPCH TTI value may be used to process DL DTCH and DL DCCH channels with or without joint coding of Class A, B, and C bits.

In an aspect, for example, network entity 110 and/or base station 112 may configure an early BLER target of 1% at slot 15 (e.g., at the end of the first 10 ms radio frame 204). In an additional or optional aspect, if the early 1% BLER target at slot 15 206 is a burden on the link capacity (e.g., achieving early 1% BLER at the end of slot 15 is not possible (or less probable) due to network conditions), the early BLER target of 1% may be configured at slot 20 (e.g., provides additional time, e.g., 5 more slots) or slot 25 (e.g., provides additional time, e.g., 10 more slots) for achieving the desired BLER. The configuration of slot numbers for early BLER target 206 may be configured based on the characteristics of the uplink (e.g., quality of the uplink, interference from other base stations, and/or UEs, etc.).

In an additional aspect, network entity 110 and/or base station 112 may continue transmission of DL DPCH on the downlink beyond (or past) the early BLER target slot (e.g., slot 15 in FIG. 2) during the second 10 ms of the 20 ms TTI. However, when the UE 102 is in the 10 ms transmission mode 240, UE 102 may not respond to transmit power control (TPC) commands from the base station 112 during the second 10 ms radio frame 208, and the base station 112 may suspend transmitting TPC commands to the UE 102. Therefore, in an aspect, base station 112 may suspend the inner loop power control (ILPC) mechanism at the base station 112, represented at 220 in FIG. 2. ILPC, for example, in the uplink, is generally defined as the ability of the UE 102 transmitter to adjust its output power in accordance with one or more transmit power control (TPC) commands received on the downlink from the base station 112 in order to keep the received uplink signal-to-interference ratio (SIR) at a given SIR target.

In an additional or optional aspect, network entity 110 and/or base station 112 may suspend (e.g., discontinue) transmission of DL DPCH on the downlink beyond the early BLER target slot (e.g., slot 15 in FIG. 2) during the second 10 ms of the 20 ms TTI. For example, base station 112 may perform a discontinuous transmission (DTX) of DL DPCH beyond the early BLER target slot in the second 10 ms of the 20 ms TTI. The DTX of DL DPCH past the early BLER target slot may improve link efficiency in the DL. In an aspect, the DTX of DL in response to suspension (e.g., possible gating) of DL DPCH may be applied at the physical channel level by DTX of the symbols over physical composite transport channel (CCtrCh).

In an additional or optional aspect, UE 102 may be configured to operate in a 20 ms transmission mode 240 or dynamically switch to the 20 ms transmission mode 242 during the next TTI, e.g., through the duration of radio frames 212 and 216. The UE 102 may indicate the 20 ms transmission mode to network entity 110 and/or base station 112 using a TFCI value of zero (at 228), as described above. Additionally, in an aspect, the UE 102 may operate in a normal ILPC state 222 (e.g., no suspension of ILPC mechanism) during the second 10 ms 216 of the (second)) 20 ms s TTI.

Figure 3:
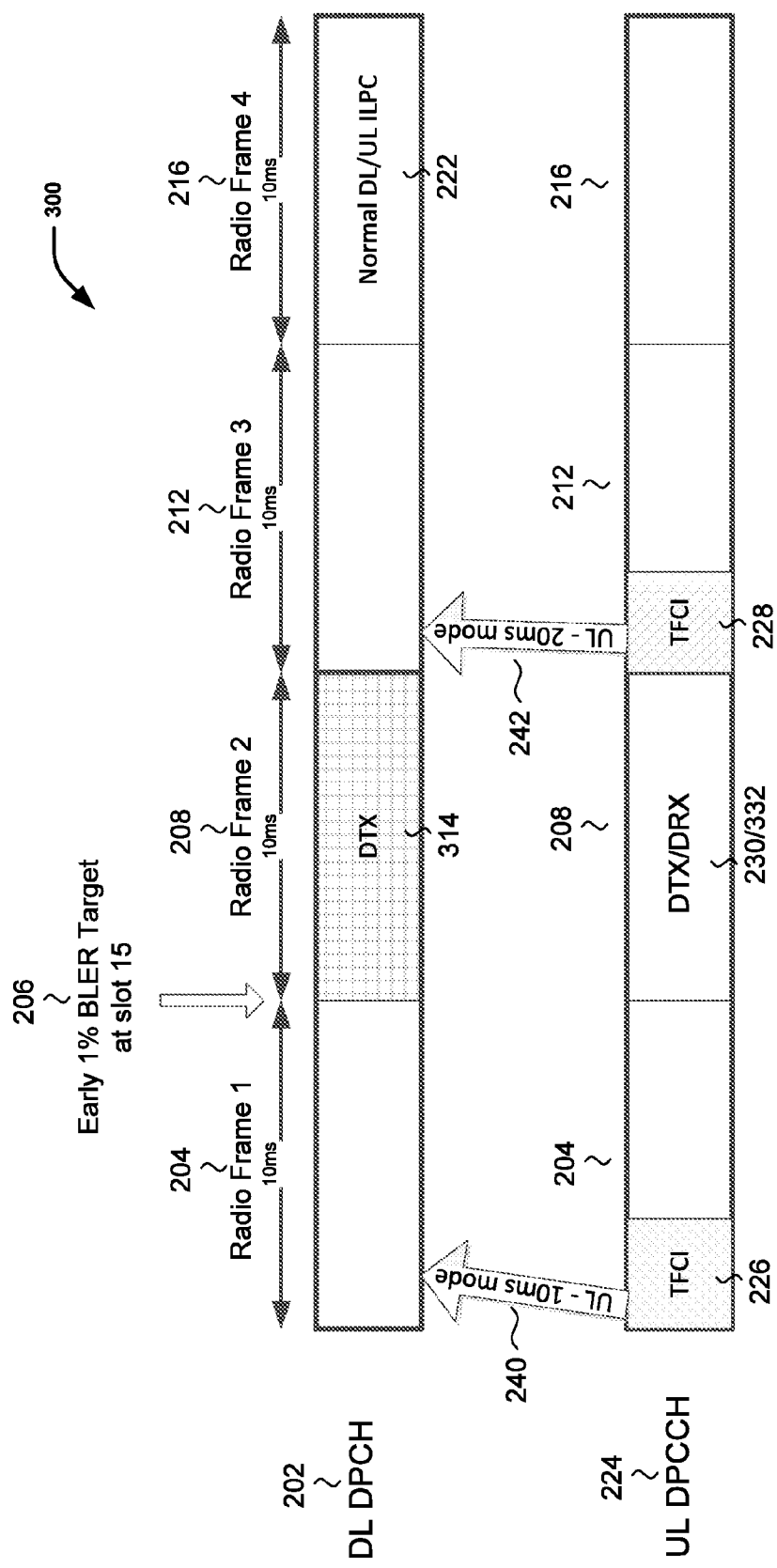

FIG. 3 illustrates an example aspect of a frame structure 300 of radio frames for downlink channel 202 and uplink channel 224 associated with UE 102 operating in a 10 ms transmission mode with early BLER target of 1% at slot 15, and discontinuous DL DPCH, in a DL FET-less operation of a DCH.

In this example aspect illustrated in FIG. 3, early BLER target of 1% at slot 15 (at 206) is configured with discontinuous transmission (DTX) 314 of DL DPCH beyond the early BLER target slot 15. That is, DL DPCH 202 is not transmitted by base station 112 beyond slot 15 once the early BLER target is reached. In an additional aspect, because of the DTX 314 of DL DPCH on the downlink, this aspect further allows UE 102 to perform a discontinuous reception (DRX) 332 (in addition to DTX 230 on the UL) for additional battery savings. Additionally, base station 112 may suspend the inner loop power control (ILPC) mechanism at the base station 112 during the second 10 ms of the 20 ms TTI.

Figure 4:
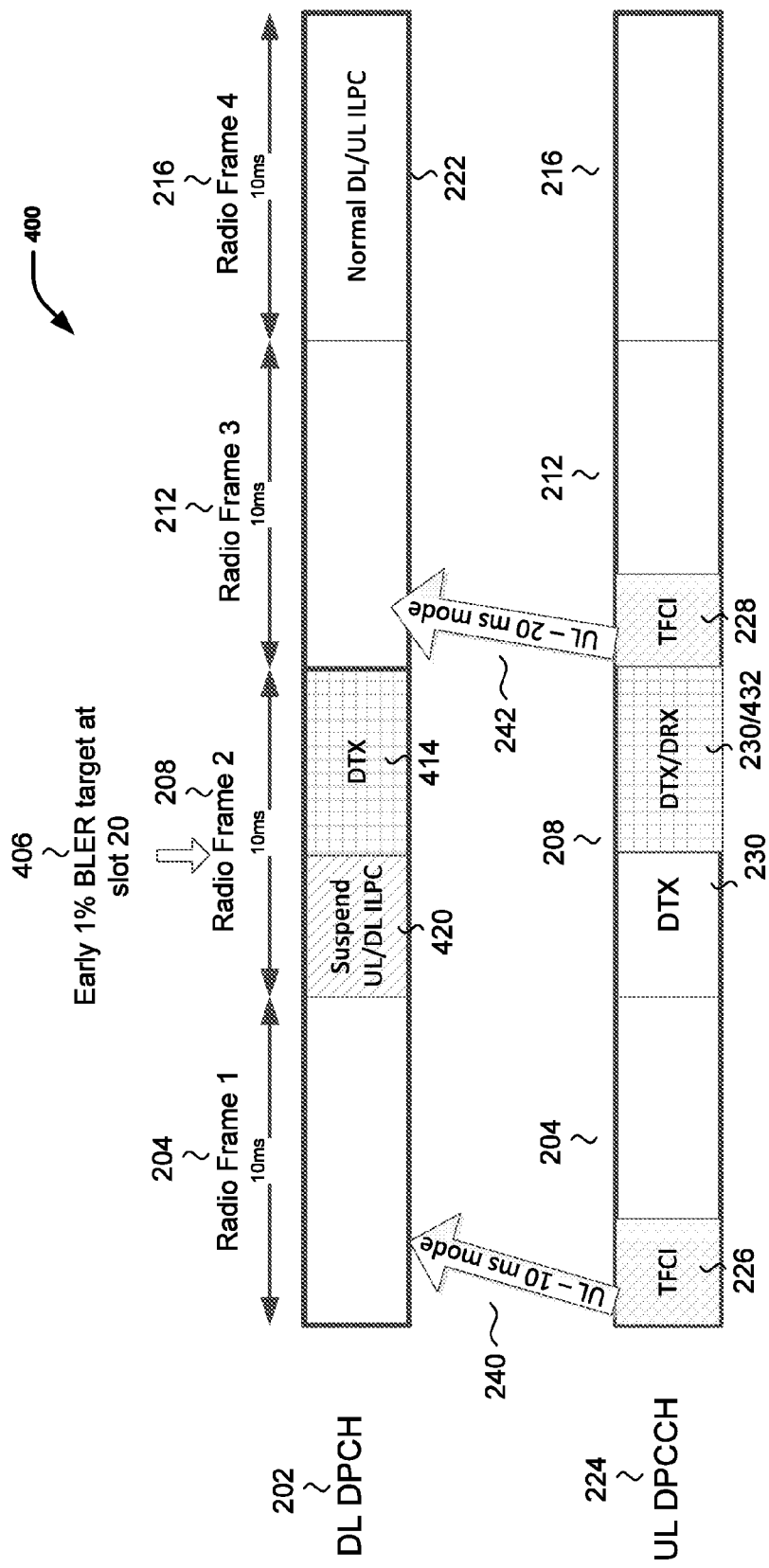

FIG. 4 illustrates an example aspect of a frame structure 400 of radio frames for downlink channel 202 and uplink channel 224 associated with UE 102 operating in a 10 ms transmission mode with early BLER target of 1% at slot 20, discontinuous DL DPCH, and suspended ILPC.

In this example aspect illustrated in FIG. 4, early BLER target of 1% at slot 20 (at 406) is configured with discontinuous transmission (DTX) 414 of DL DPCH 202 beyond slot 20 of the second 10 ms of the 20 ms TTI. That is, DL DPCH 202 is not transmitted by base station 112 beyond slot 20 once the early BLER target 406 is reached at slot 20. In an additional aspect, this allows UE 102 to perform a discontinuous reception (DRX) 432 (in addition to DTX 230 on the UL) beyond slot 20 at the UE for additional battery savings. Additionally, base station 112 may suspend the inner loop power control (ILPC) mechanism at the base station 112 during the second 10 ms of the 20 ms TTI.

Figure 5:
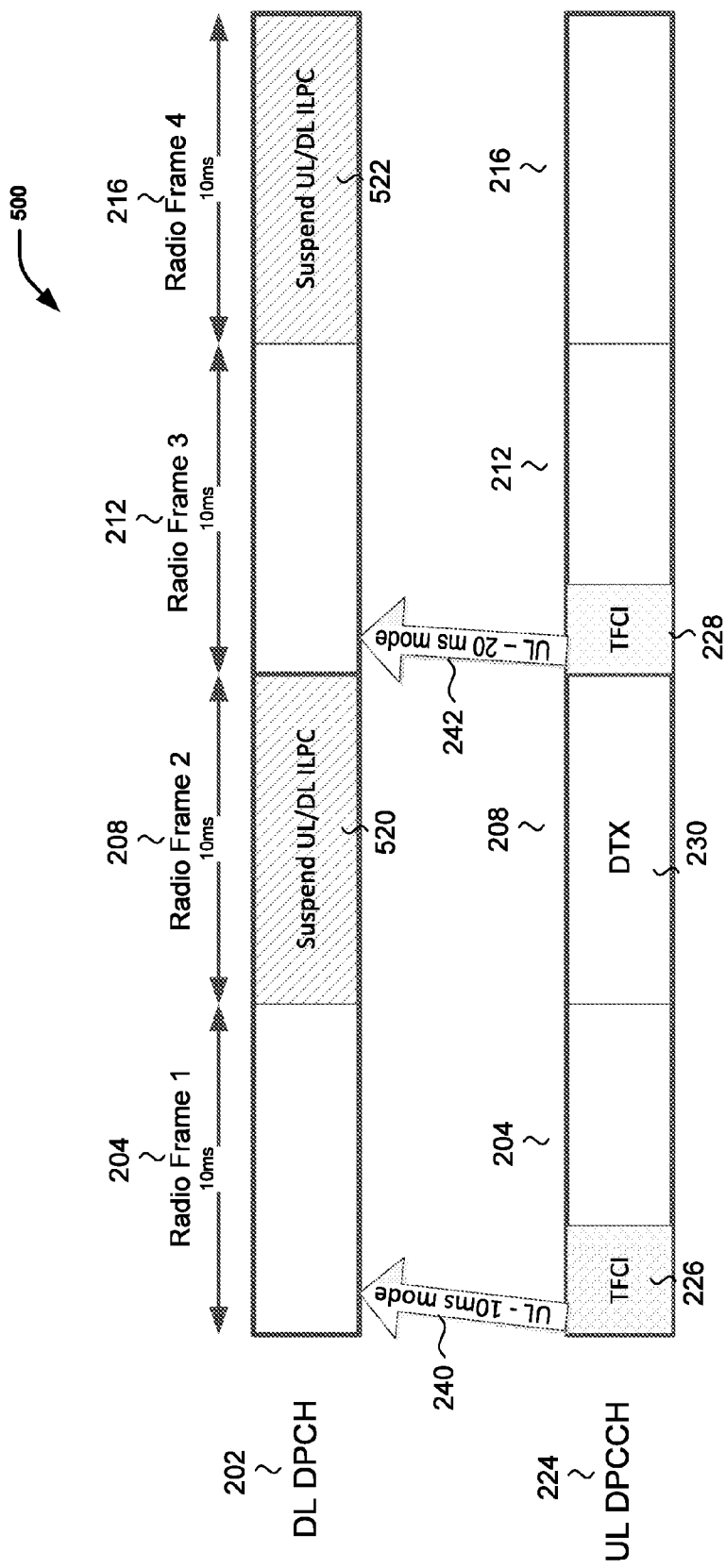

FIG. 5 illustrates an example aspect of a frame structure 500 of radio frames for downlink channel 202 and uplink channel 224 associated with UE 102 operating in a 10 ms transmission mode for all BLER configurations, always-on DL DPCH, and always suspended ILPC.

In this example aspect illustrated in FIG. 5, early BLER target of 1% may be configured for any slot during the duration of the second 10 ms radio frame 208 with always-on transmission of DL DPCH. Additionally, the ILPC mechanism is always suspended (e.g., for reducing complexity during implementation) during the duration of the second 10 ms of the 20 ms TTI, e.g., during radio frame 2 (208) and radio frame 4 (216), represented by 520 and 522 in FIG. 5. This eliminates the need for the base station to have to identify (or determine) whether the UL is in a 10 ms transmission mode or a 20 ms transmission mode. However, this may slightly impact the UL performance when the UL is in a 20 ms transmission mode due to the absence of ILPC during the second 10 ms of the 20 ms TTI.

Figure 6:
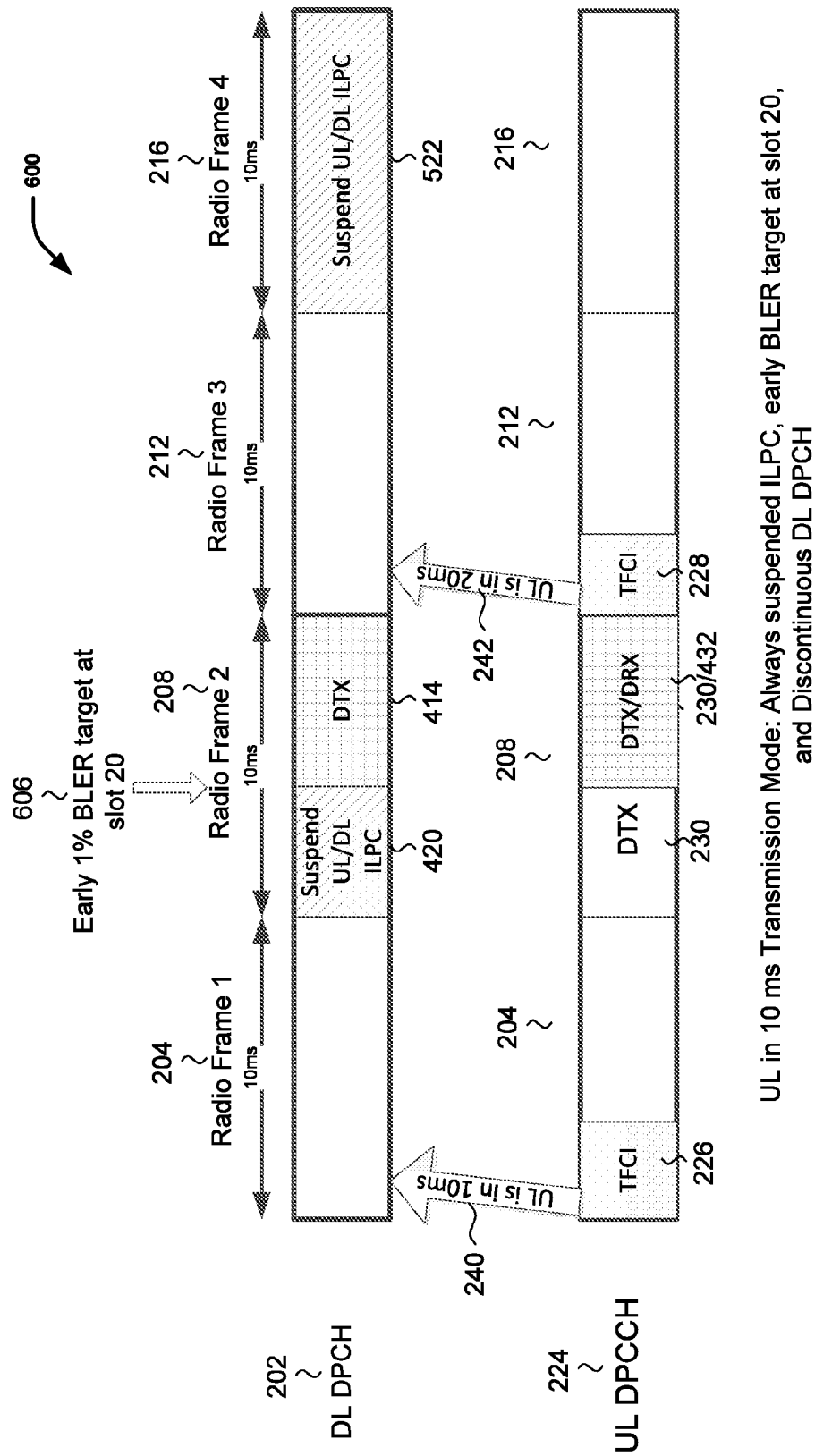

FIG. 6 illustrates an example aspect of a frame structure 600 of radio frames for downlink channel 202 and uplink channel 224 associated with UE 102 operating in a 10 ms transmission mode with early BLER target of 1% at slot 20, discontinuous DL DPCH, and always suspended ILPC.

In this example aspect illustrated in FIG. 6, early BLER target of 1% is configured at slot 20 (at 606) with discontinuous transmission (DTX) 414 of DL DPCH beyond the early BLER target slot 20. Additionally, the ILPC mechanism is always suspended, e.g., at 420 and 522, during the duration of the respective second 10 ms of the 20 ms TTI.

Figure 7:
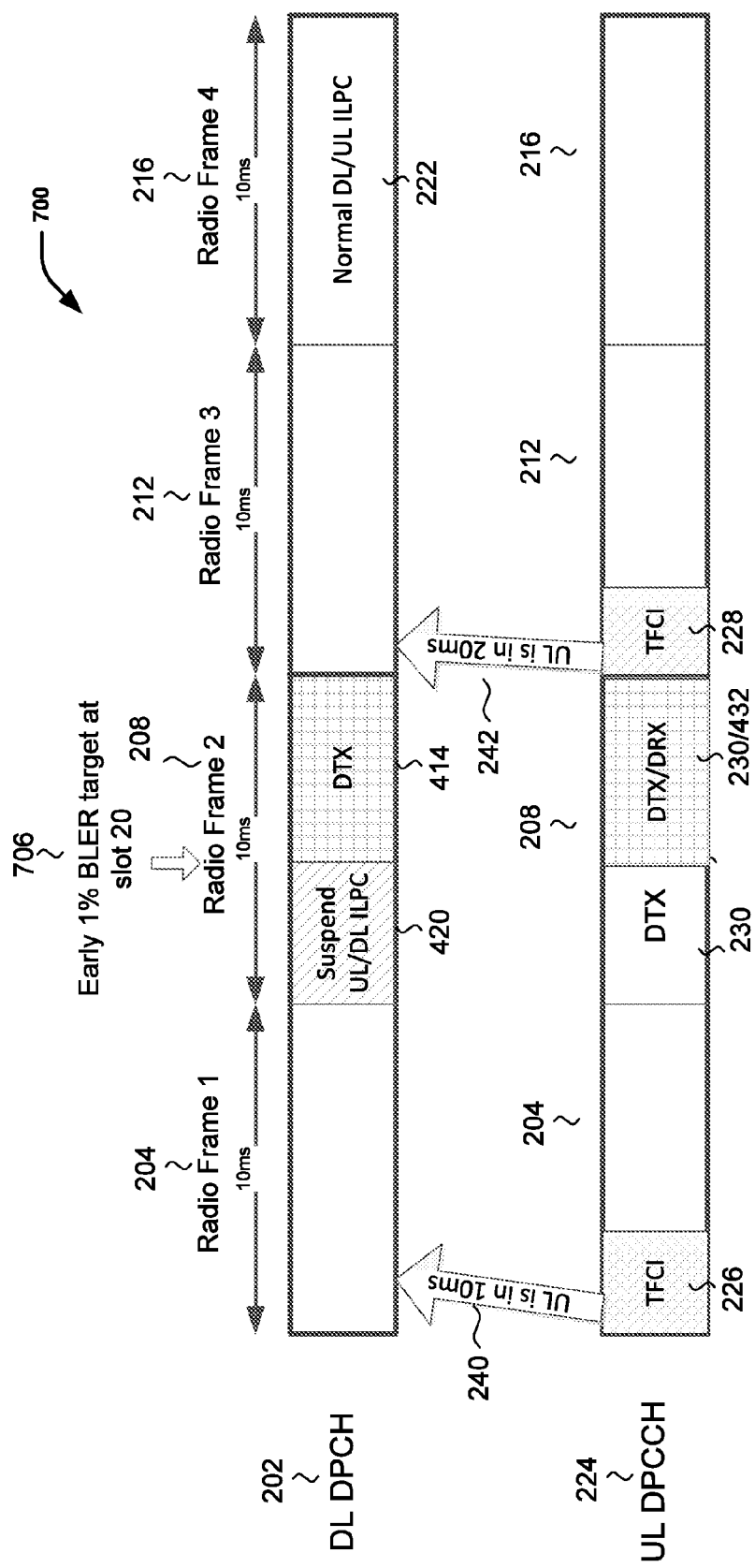

FIG. 7 illustrates an example aspect of a frame structure 700 of radio frames for downlink channel 202 and uplink channel 224 associated with UE 102 operating in a 10 ms transmission mode with early BLER target of 1% at slot 20, discontinuous DL DPCH, and suspended ILPC.

In this example aspect illustrated in FIG. 7, early BLER target of 1% is configured at slot 20 (at 706) with discontinuous transmission (DTX) 414 of DL DPCH 202 beyond the early BLER target slot 20. Additionally, the ILPC mechanism is suspended, e.g., at 420, during the second 10 ms radio frame (208) from slots 16-20.

Although, 1% BLER value is illustrated in FIGS. 2-7, other BLER values may also be used.

Figure 8:
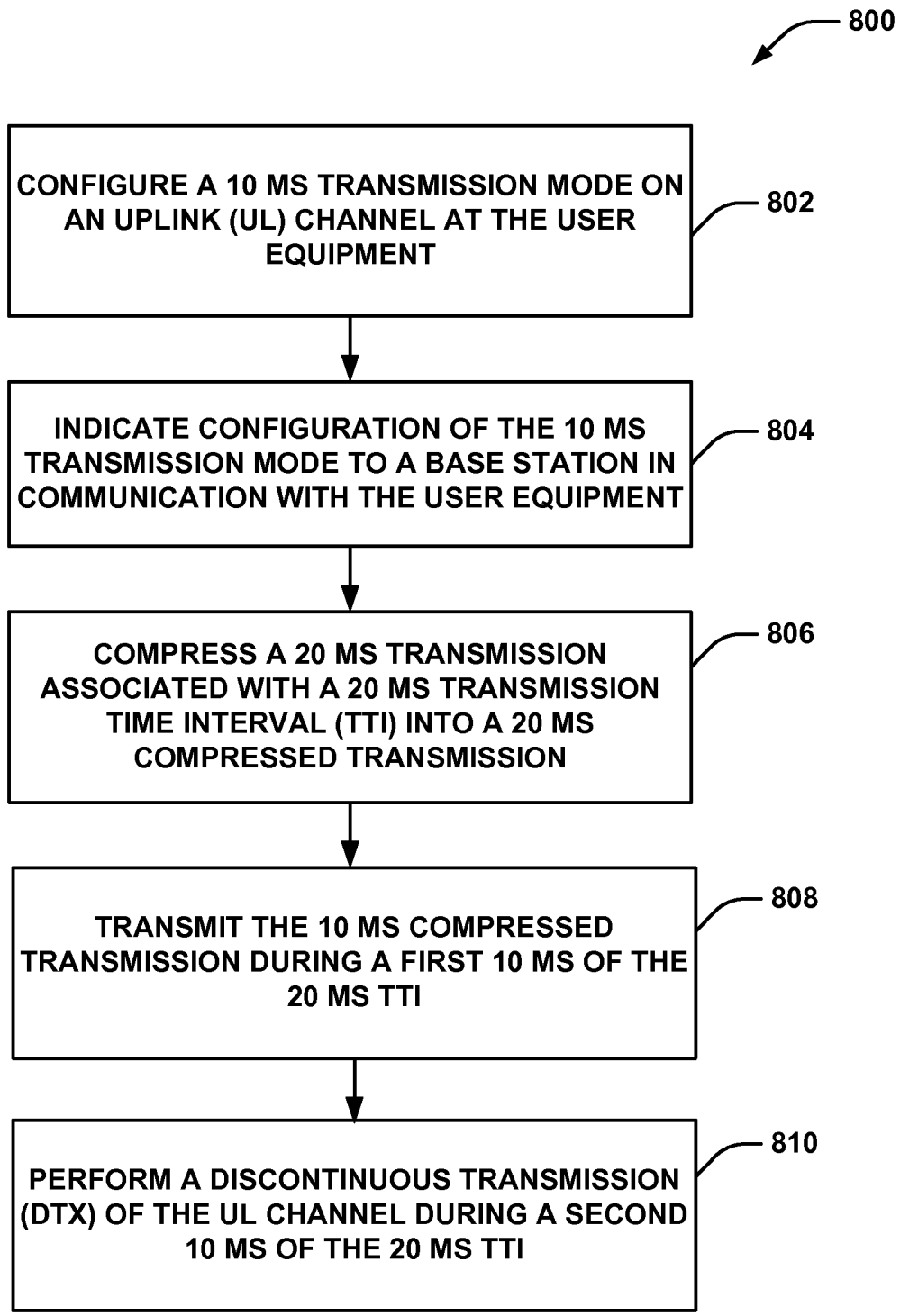
FIG. 8 is a flow diagram illustrating aspects of an example method in aspects of the present disclosure.

FIG. 8 illustrates an example methodology 800 for reducing battery consumption during operation of a dedicated channel (DCH) at a user equipment (UE).

In an aspect, at block 802, methodology 800 may include configuring a 10 ms transmission mode on an uplink (UL) channel at the UE. For example, in an aspect, UE 102 and/or configuration manager 104 may include a specially programmed processor module, or a processor executing specially programmed code stored in a memory, to configure a 10 ms transmission mode 240 on an uplink (UL) channel at the UE. As described above, in reference to FIG. 2, for example, UL DPCCH 224 may be configured in the 10 ms transmission mode for reducing battery consumption at the UE. For instance, in an aspect, UE 102 and/or configuration manager 104 may configure the transmission mode of an UL channel (e.g., 10 ms transmission mode or 20 ms transmission mode) based on UE power headroom. In an aspect, as discussed below with regard to FIG. 9, configuration manager 104 may include a transmission mode configuration component 902 to perform this functionality.

In an aspect, at block 804, methodology 800 may include indicating configuration of the 10 ms transmission mode to a base station in communication with the UE. For example, in an aspect, UE 102 and/or configuration manager 104 may include a specially programmed processor module, or a processor executing specially programmed code stored in a memory, to indicate configuration of the 10 ms transmission mode to base station 112 in communication with UE 102. For instance, in an aspect, UE 102 and/or configuration manager 104 may set of a value of TFCI 226 to a certain value (e.g., a value of 1) that identifies or indicates the 10 ms transmission mode, and transmitting TFCI 226 to base station 112, such as via a communication component (e.g., transceiver) of UE 102 transmitting TFCI 226 in a radio frame on a communication link (e.g., UL DPCCH 224). In an aspect, as discussed below with regard to FIG. 9, configuration manager 104 may include a transmission mode indicating component 904 to perform this functionality.

In an aspect, at block 806, methodology 800 may include compressing a 20 ms transmission associated with a 20 ms transmission time interval (TTI) into a 10 ms compressed transmission. For example, in an aspect, UE 102 and/or configuration manager 104 may include a specially programmed processor module, or a processor executing specially programmed code stored in a memory, to compress a 20 ms transmission associated with a 20 ms transmission time interval (TTI) into a 10 ms compressed transmission. For instance, in an aspect, UE 102 and/or configuration manager 104 may compress a 20 ms transmission (204, 208) into a 10 ms compressed transmission for transmitting on UL 114 in 10 ms. The 20 ms transmission may be compressed, for example, by decreasing the spreading factor by 2:1 (i.e., increases the data rate so bits will get sent twice as fast), puncturing bits (which will remove bits from the original data and reduce the amount of information that needs to be transmitted), or changing of higher layer scheduling to use less timeslots for user traffic. In an aspect, as discussed below with regard to FIG. 9, configuration manager 104 may include a compression component 906 to perform this functionality.

In an aspect, at block 808, methodology 800 may include transmitting the 10 ms compressed transmission during a first 10 ms of the 20 ms TTI. For example, in an aspect, UE 102 and/or configuration manager 104 may include a specially programmed processor module, or a processor executing specially programmed code stored in a memory, to transmit the 10 ms compressed transmission during a first 10 ms of the 20 ms TTI. For instance, in an aspect, UE 102 and/or configuration manager 104 may transmit the compressed transmission to base station 112, such as via a communication component (e.g., transceiver) of UE 102. In an aspect, as discussed below with regard to FIG. 9, configuration manager 104 may include a transmission component 908 to perform this functionality.

In an aspect, at block 810, methodology 800 may include performing a discontinuous transmission (DTX) of the UL channel during a second 10 ms of the 20 ms TTI. For example, in an aspect, UE 102 and/or configuration manager 104 may include a specially programmed processor module, or a processor executing specially programmed code stored in a memory, to perform a discontinuous transmission (DTX), e.g., stop transmitting or enter a sleep mode, of the UL channel during a second 10 ms of the 20 ms TTI, e.g., to save battery power. In an aspect, as discussed below with regard to FIG. 9, configuration manager 104 may include a DTX component 910 to perform this functionality.

Thus, as described above, reduced battery consumption at a UE may be achieved.

Figure 9:
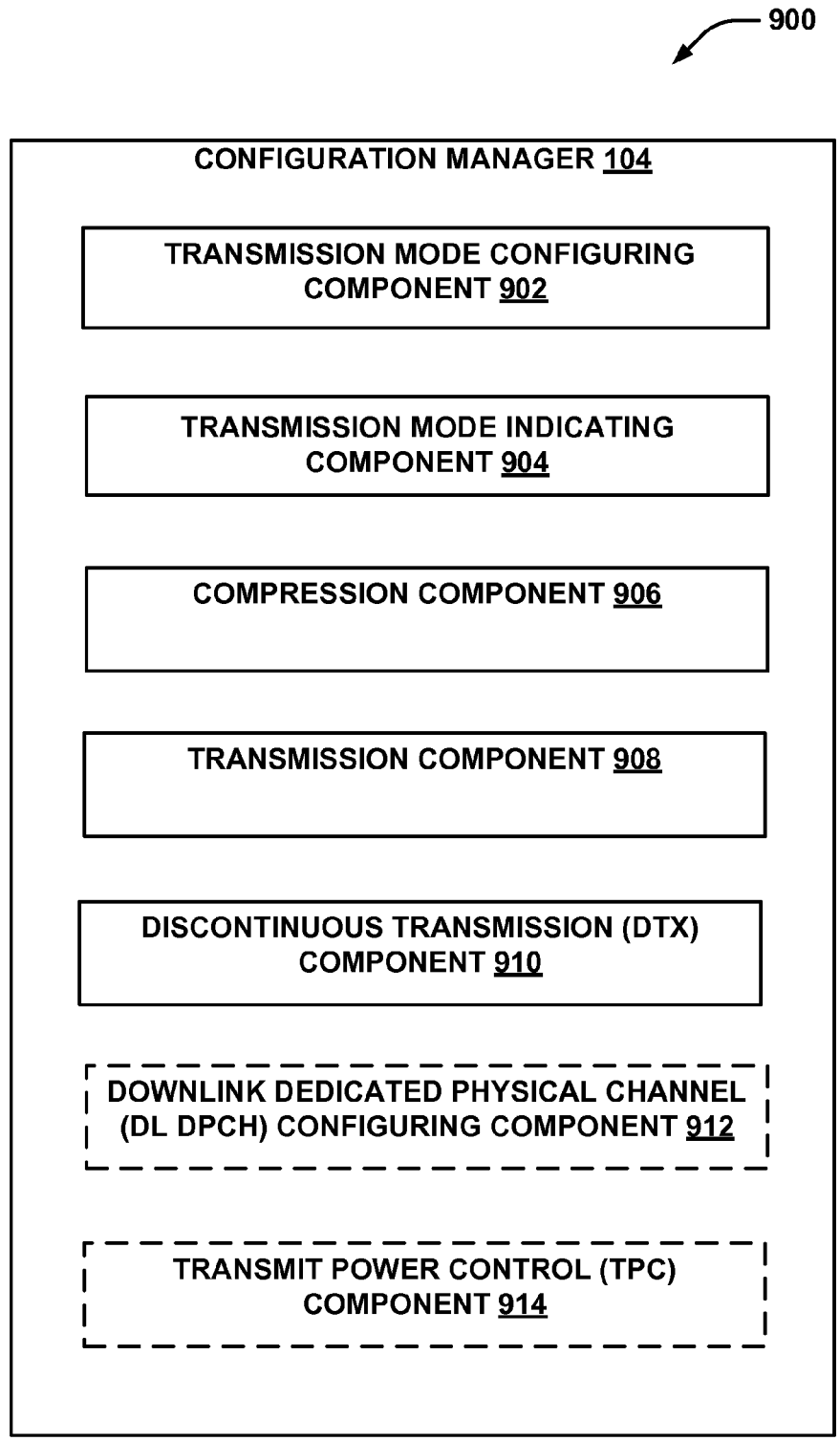
FIG. 9 is a block diagram illustrating an example configuration manager in aspects of the present disclosure.

Referring to FIG. 9, illustrated are an example configuration manager 104 and various sub-components for reducing battery consumption at a user equipment (UE). In an example aspect, configuration manager 104 may be configured to include the specially programmed processor module, or the processor executing specially programmed code stored in a memory, in the form of a transmission mode configuring component 902, a transmission mode indicating component 904, a compression component 906, a transmission component 908, and/or a discontinuous transmission component 910, such as in specially programmed computer readable instructions or code, firmware, hardware, or some combination thereof. In an aspect, a component may be one of the parts that make up a system, may be hardware or software, and may be divided into other components.

In an aspect, configuration manager 104 and/or transmission mode configuring component 902 may be configured to configure a 10 ms transmission mode on an uplink (UL) at the UE. For example, in an aspect, transmission mode configuring component 902 may be configured to configure a 10 ms transmission mode 240 on the UL at UE 102.

In an aspect, configuration manager 104 and/or transmission mode indicating component 904 may be configured to indicate configuration of the 10 ms transmission mode to a base station in communication with the UE. For example, in an aspect, transmission mode indicating component 904 may be configured to indicate that the UE is configured to transmit in a 10 ms transmission mode 240 to base station 112.

In an aspect, configuration manager 104 and/or compression component 906 may be configured to compress a 20 ms transmission associated with a 20 ms transmission time interval (TTI) into a 10 ms compressed transmission. For example, in an aspect, compression component 906 may be configured to compress a 20 ms transmission associated with a 20 ms TTI (204 and 208) into one 10 ms compressed transmission.

In an aspect, configuration manager 104 and/or transmission component 908 may be configured to transmit the 10 ms compressed transmission during a first 10 ms of the 20 ms TTI. For example, in an aspect, transmission component 908 may be configured to transmit the compressed transmission to base station 112 during a first 10 ms 204 of the 20 ms TTI.

In an aspect, configuration manager 104 and/or discontinuous transmission component 910 may be configured to perform a discontinuous transmission (DTX) of the UL during a second 10 ms of the 20 ms TTI. For example, in an aspect, discontinuous transmission component 910 may be configured to perform a discontinuous transmission of the UL during a second 10 ms 208 of the 20 ms TTI.

In an additional or optional aspect, configuration manager 104 and/or DL DPCH configuring component 912 may be configured to receive a DL DPCH during whole duration of the 20 ms TTI. For example, in an aspect, DL DPCH configuring component 912 may be configured to receive a DL DPCH during whole duration of the 20 ms TTI, e.g., during the duration of radio frames 204 and 208. For instance, in an aspect, UE 102 and/or configuration manager 104 may receive DL DPCH from base station 112, e.g., via a communication component (e.g., transceiver) of UE 102.

In an additional or optional aspect, configuration manager 104 and/or TPC component 914 may be configured to suspend transmission of transmit power control (TPC) commands to the base station during the second 10 ms of the 20 ms TTI. For example, in an aspect, TPC component 914 may be configured to suspend transmission of transmit power control (TPC) commands to the base station during the second 10 ms of 20 ms TTI (e.g., radio frame 208). For instance, in an aspect, UE 102 and/or configuration manager 104 may suspend transmission power control (TPC) commands on the UL channel by not responding to the TPC commands received on the DL from base station 112, such as via a communication component (e.g., transceiver) of UE 102.

Figure 10:
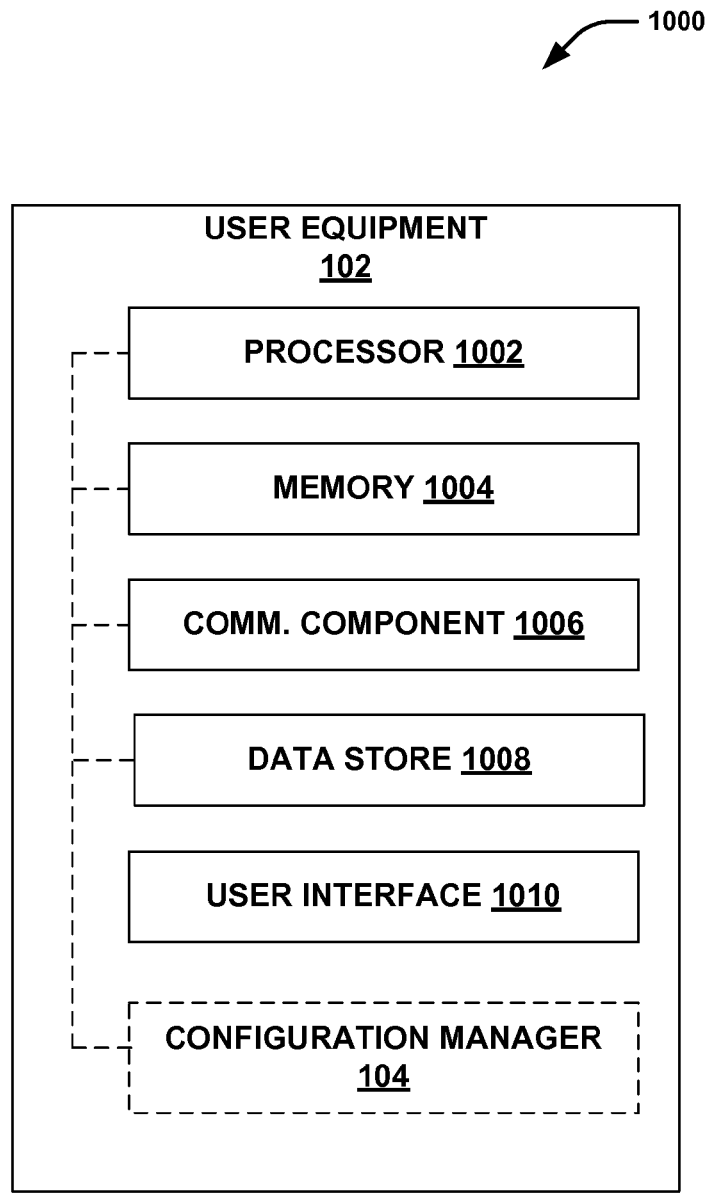
FIG. 10 is a block diagram illustrating aspects of an example user equipment including a configuration manager according to the present disclosure.

Referring to FIG. 10, in an aspect, UE 102, for example, including configuration manager 104, may be or may include a specially programmed or configured computer device to perform the functions described herein. In one aspect of implementation, UE 102 may include configuration manager 104 and its sub-components, including transmission mode configuring component 902, transmission mode indicating component 904, compression component 906, transmission component 908, and/or discontinuous transmission component 910, such as in specially programmed computer readable instructions or code, firmware, hardware, or some combination thereof.

In an aspect, for example as represented by the dashed lines, configuration manager 104 may be implemented in or executed using one or any combination of processor 1002, memory 1004, communications component 1006, and data store 1008. For example, configuration manager 104 may be defined or otherwise programmed as one or more processor modules of processor 1002. Further, for example, configuration 104 may be defined as a computer-readable medium (e.g., a non-transitory computer-readable medium) stored in memory 1004 and/or data store 1008 and executed by processor 1002. Moreover, for example, inputs and outputs relating to operations of configuration manager 104 may be provided or supported by communications component 1006, which may provide a bus between the components of computer device 1000 or an interface for communication with external devices or components.

UE 102 may include processor 1002 specially configured to carry out processing functions associated with one or more of components and functions described herein. Processor 1002 can include a single or multiple set of processors or multi-core processors. Moreover, processor 1002 can be implemented as an integrated processing system and/or a distributed processing system.

User equipment 102 further includes memory 1004, such as for storing data used herein and/or local versions of applications and/or instructions or code being executed by processor 1002, such as to perform the respective functions of the respective entities described herein. Memory 1004 can include any type of memory usable by a computer, such as random access memory (RAM), read only memory (ROM), tapes, magnetic discs, optical discs, volatile memory, non-volatile memory, and any combination thereof.

Further, user equipment 102 includes communications component 1006 that provides for establishing and maintaining communications with one or more parties utilizing hardware, software, and services as described herein. Communications component 1006 may carry communications between components on user equipment 102, as well as between user and external devices, such as devices located across a communications network and/or devices serially or locally connected to user equipment 102. For example, communications component 1006 may include one or more buses, and may further include transmit chain components and receive chain components associated with a transmitter and receiver, respectively, or a transceiver, operable for interfacing with external devices.

Additionally, user equipment 102 may further include data store 1008, which can be any suitable combination of hardware and/or software, that provides for mass storage of information, databases, and programs employed in connection with aspects described herein. For example, data store 1008 may be a data repository for applications not currently being executed by processor 1002.

User equipment 102 may additionally include a user interface component 1010 operable to receive inputs from a user of user equipment 102, and further operable to generate outputs for presentation to the user. User interface component 1010 may include one or more input devices, including but not limited to a keyboard, a number pad, a mouse, a touch-sensitive display, a navigation key, a function key, a microphone, a voice recognition component, any other mechanism capable of receiving an input from a user, or any combination thereof. Further, user interface component 1010 may include one or more output devices, including but not limited to a display, a speaker, a haptic feedback mechanism, a printer, any other mechanism capable of presenting an output to a user, or any combination thereof.

The various concepts presented throughout this disclosure may be implemented across a broad variety of telecommunication systems, network architectures, and communication standards.

Figure 11:
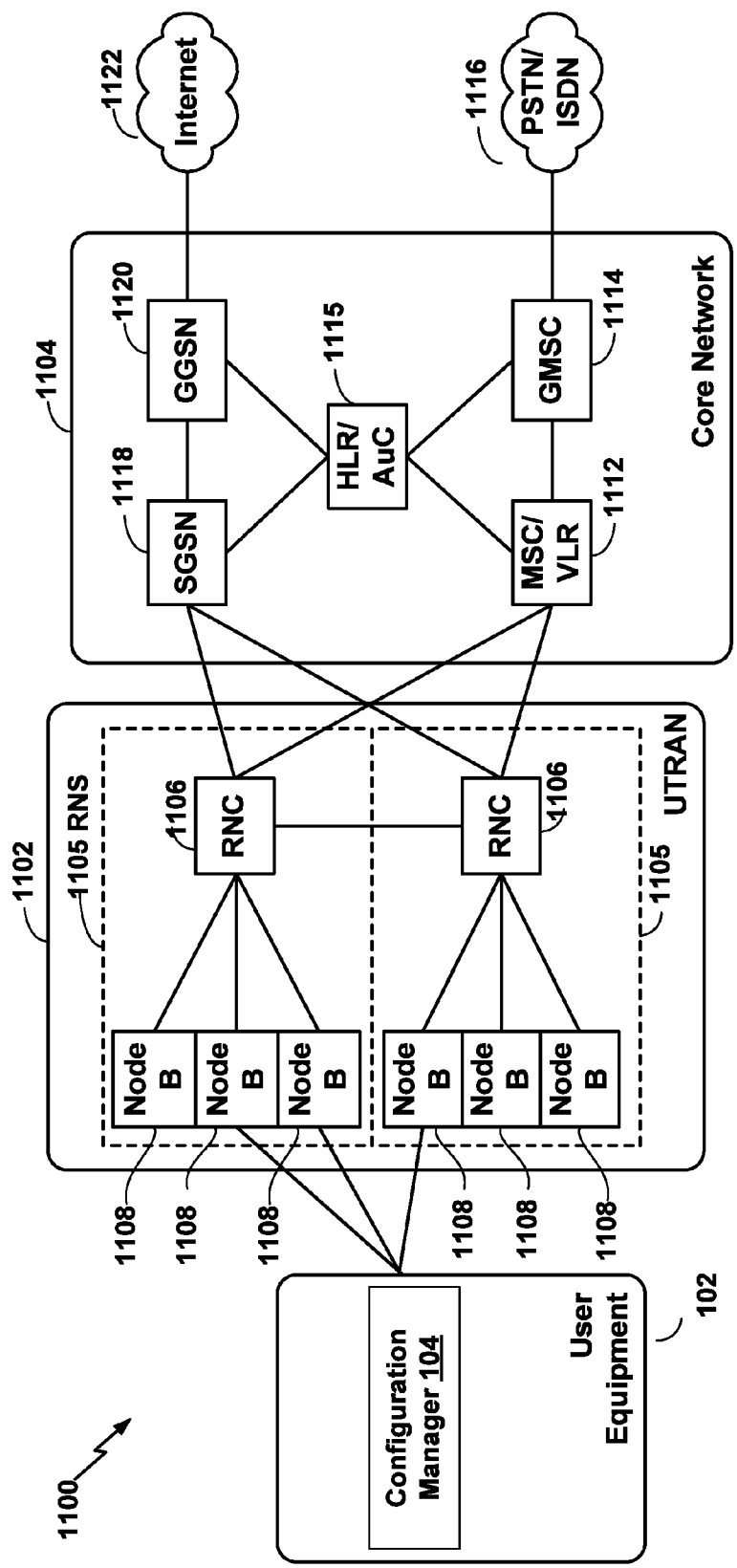
FIG. 11 is a block diagram conceptually illustrating an example of a telecommunications system including a user equipment with a configuration manager according to the present disclosure.

Referring to FIG. 11, by way of example and without limitation, the aspects of the present disclosure are presented with reference to a UMTS system 1100 employing a W-CDMA air interface, and may include a UE 102 executing an aspect of configuration manager 104 of FIGS. 1 and 9. A UMTS network includes three interacting domains: a Core Network (CN) 1104, a UMTS Terrestrial Radio Access Network (UTRAN) 1102, and UE 102. In an aspect, as noted, UE 102 (FIG. 1) may be configured to perform functions thereof, for example, including reducing battery consumption during operation of a dedicated channel (DCH) at the UE. Further, UTRAN 1102 may comprise network entity 110 and/or base station 112 (FIG. 1), which in this case may be respective ones of the Node Bs 1108. In this example, UTRAN 1102 provides various wireless services including telephony, video, data, messaging, broadcasts, and/or other services. The UTRAN 1102 may include a plurality of Radio Network Subsystems (RNSs) such as a RNS 1105, each controlled by a respective Radio Network Controller (RNC) such as an RNC 1106. Here, the UTRAN 1102 may include any number of RNCs 1106 and RNSs 1105 in addition to the RNCs 1106 and RNSs 1105 illustrated herein. The RNC 1106 is an apparatus responsible for, among other things, assigning, reconfiguring, and releasing radio resources within the RNS 1105. The RNC 1106 may be interconnected to other RNCs (not shown) in the UTRAN 1102 through various types of interfaces such as a direct physical connection, a virtual network, or the like, using any suitable transport network.

Communication between UE 102 and Node B 1108 may be considered as including a physical (PHY) layer and a medium access control (MAC) layer. Further, communication between UE 102 and RNC 1106 by way of a respective Node B 1108 may be considered as including a radio resource control (RRC) layer. In the instant specification, the PHY layer may be considered layer 1; the MAC layer may be considered layer 2; and the RRC layer may be considered layer 3. Information herein below utilizes terminology introduced in the RRC Protocol Specification, 3GPP TS 1111.331 v11.1.0, incorporated herein by reference.

The geographic region covered by the RNS 1105 may be divided into a number of cells, with a radio transceiver apparatus serving each cell. A radio transceiver apparatus is commonly referred to as a Node B in UMTS applications, but may also be referred to by those skilled in the art as a base station (BS), a base transceiver station (BTS), a radio base station, a radio transceiver, a transceiver function, a basic service set (BSS), an extended service set (ESS), an access point (AP), or some other suitable terminology. For clarity, three Node Bs 1108 are shown in each RNS 1105; however, the RNSs 1105 may include any number of wireless Node Bs. The Node Bs 1108 provide wireless access points to a CN 1104 for any number of mobile apparatuses, such as UE 102, and may be network entity 110 and/or base station 112 of FIG. 1. Examples of a mobile apparatus include a cellular phone, a smart phone, a session initiation protocol (SIP) phone, a laptop, a notebook, a netbook, a smartbook, a personal digital assistant (PDA), a satellite radio, a global positioning system (GPS) device, a multimedia device, a video device, a digital audio player (e.g., MP3 player), a camera, a game console, or any other similar functioning device. The mobile apparatus in this case is commonly referred to as a UE in UMTS applications, but may also be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a terminal, a user agent, a mobile client, a client, or some other suitable terminology.

For illustrative purposes, one UE 102 is shown in communication with a number of the Node Bs 1108. The DL, also called the forward link, refers to the communication link from a Node B 1108 to a UE 102 (e.g., link 116), and the UL, also called the reverse link, refers to the communication link from a UE 102 to a Node B 1108 (e.g., link 114).

The CN 1104 interfaces with one or more access networks, such as the UTRAN 1102. As shown, the CN 1104 is a GSM core network. However, as those skilled in the art will recognize, the various concepts presented throughout this disclosure may be implemented in a RAN, or other suitable access network, to provide UEs with access to types of CNs other than GSM networks.

The CN 1104 includes a circuit-switched (CS) domain and a packet-switched (PS) domain. Some of the circuit-switched elements are a Mobile services Switching Centre (MSC), a Visitor location register (VLR) and a Gateway MSC. Packet-switched elements include a Serving GPRS Support Node (SGSN) and a Gateway GPRS Support Node (GGSN). Some network elements, like EIR, HLR, VLR and AuC may be shared by both of the circuit-switched and packet-switched domains. In the illustrated example, the CN 1104 supports circuit-switched services with a MSC 1112 and a GMSC 1114. In some applications, the GMSC 1114 may be referred to as a media gateway (MGW). One or more RNCs, such as the RNC 1106, may be connected to the MSC 1112. The MSC 1112 is an apparatus that controls call setup, call routing, and UE mobility functions. The MSC 1112 also includes a VLR that contains subscriber-related information for the duration that a UE is in the coverage area of the MSC 1112. The GMSC 1114 provides a gateway through the MSC 1112 for the UE to access a circuit-switched network 1116. The GMSC 1114 includes a home location register (HLR) 1115 containing subscriber data, such as the data reflecting the details of the services to which a particular user has subscribed. The HLR is also associated with an authentication center (AuC) that contains subscriber-specific authentication data. When a call is received for a particular UE, the GMSC 1114 queries the HLR 1115 to determine the UE's location and forwards the call to the particular MSC serving that location.

The CN 1104 also supports packet-data services with a serving GPRS support node (SGSN) 1118 and a gateway GPRS support node (GGSN) 1120. GPRS, which stands for General Packet Radio Service, is designed to provide packet-data services at speeds higher than those available with standard circuit-switched data services. The GGSN 1120 provides a connection for the UTRAN 1102 to a packet-based network 1122. The packet-based network 1122 may be the Internet, a private data network, or some other suitable packet-based network. The primary function of the GGSN 1120 is to provide the UEs 104 with packet-based network connectivity. Data packets may be transferred between the GGSN 1120 and the UEs 102 through the SGSN 1118, which performs primarily the same functions in the packet-based domain as the MSC 1112 performs in the circuit-switched domain.

An air interface for UMTS may utilize a spread spectrum Direct-Sequence Code Division Multiple Access (DS-CDMA) system. The spread spectrum DS-CDMA spreads user data through multiplication by a sequence of pseudo-random bits called chips. The "wideband" W-CDMA air interface for UMTS is based on such direct sequence spread spectrum technology and additionally calls for a frequency division duplexing (FDD). FDD uses a different carrier frequency for the UL and DL between a Node B 1108 and a UE 102. Another air interface for UMTS that utilizes DS-CDMA, and uses time division duplexing (TDD), is the TD-SCDMA air interface. Those skilled in the art will recognize that although various examples described herein may refer to a W-CDMA air interface, the underlying principles may be equally applicable to a TD-SCDMA air interface.

An HSPA air interface includes a series of enhancements to the 3G/W-CDMA air interface, facilitating greater throughput and reduced latency. Among other modifications over prior releases, HSPA utilizes hybrid automatic repeat request (HARQ), shared channel transmission, and adaptive modulation and coding. The standards that define HSPA include HSDPA (high speed downlink packet access) and HSUPA (high speed uplink packet access, also referred to as enhanced uplink, or EUL).

HSDPA utilizes as its transport channel the high-speed downlink shared channel (HS-DSCH). The HS-DSCH is implemented by three physical channels: the high-speed physical downlink shared channel (HS-PDSCH), the high-speed shared control channel (HS-SCCH), and the high-speed dedicated physical control channel (HS-DPCCH).

Among these physical channels, the HS-DPCCH carries the HARQ ACK/NACK signaling on the uplink to indicate whether a corresponding packet transmission was decoded successfully. That is, with respect to the downlink, the UE 102 provides feedback to Node B 508 over the HS-DPCCH to indicate whether it correctly decoded a packet on the downlink.

HS-DPCCH further includes feedback signaling from the UE 102 to assist the Node B 508 in taking the right decision in terms of modulation and coding scheme and precoding weight selection, this feedback signaling including the CQI and PCI.

HSPA Evolved or HSPA+ is an evolution of the HSPA standard that includes MIMO and 64-QAM, enabling increased throughput and higher performance. That is, in an aspect of the disclosure, the Node B 508 and/or the UE 102 may have multiple antennas supporting MIMO technology. The use of MIMO technology enables the Node B 508 to exploit the spatial domain to support spatial multiplexing, beamforming, and transmit diversity.

Multiple Input Multiple Output (MIMO) is a term generally used to refer to multi-antenna technology, that is, multiple transmit antennas (multiple inputs to the channel) and multiple receive antennas (multiple outputs from the channel). MIMO systems generally enhance data transmission performance, enabling diversity gains to reduce multipath fading and increase transmission quality, and spatial multiplexing gains to increase data throughput.

Spatial multiplexing may be used to transmit different streams of data simultaneously on the same frequency. The data steams may be transmitted to a single UE 102 to increase the data rate or to multiple UEs 102 to increase the overall system capacity. This is achieved by spatially precoding each data stream and then transmitting each spatially precoded stream through a different transmit antenna on the downlink. The spatially precoded data streams arrive at the UE(s) 102 with different spatial signatures, which enables each of the UE(s) 102 to recover the one or more the data streams destined for that UE 102. On the uplink, each UE 102 may transmit one or more spatially precoded data streams, which enables Node B 1108 to identify the source of each spatially precoded data stream.

Spatial multiplexing may be used when channel conditions are good. When channel conditions are less favorable, beamforming may be used to focus the transmission energy in one or more directions, or to improve transmission based on characteristics of the channel. This may be achieved by spatially precoding a data stream for transmission through multiple antennas. To achieve good coverage at the edges of the cell, a single stream beamforming transmission may be used in combination with transmit diversity.

Generally, for MIMO systems utilizing n transmit antennas, n transport blocks may be transmitted simultaneously over the same carrier utilizing the same channelization code. Note that the different transport blocks sent over the n transmit antennas may have the same or different modulation and coding schemes from one another.

On the other hand, Single Input Multiple Output (SIMO) generally refers to a system utilizing a single transmit antenna (a single input to the channel) and multiple receive antennas (multiple outputs from the channel). Thus, in a SIMO system, a single transport block is sent over the respective carrier.

Figure 12:
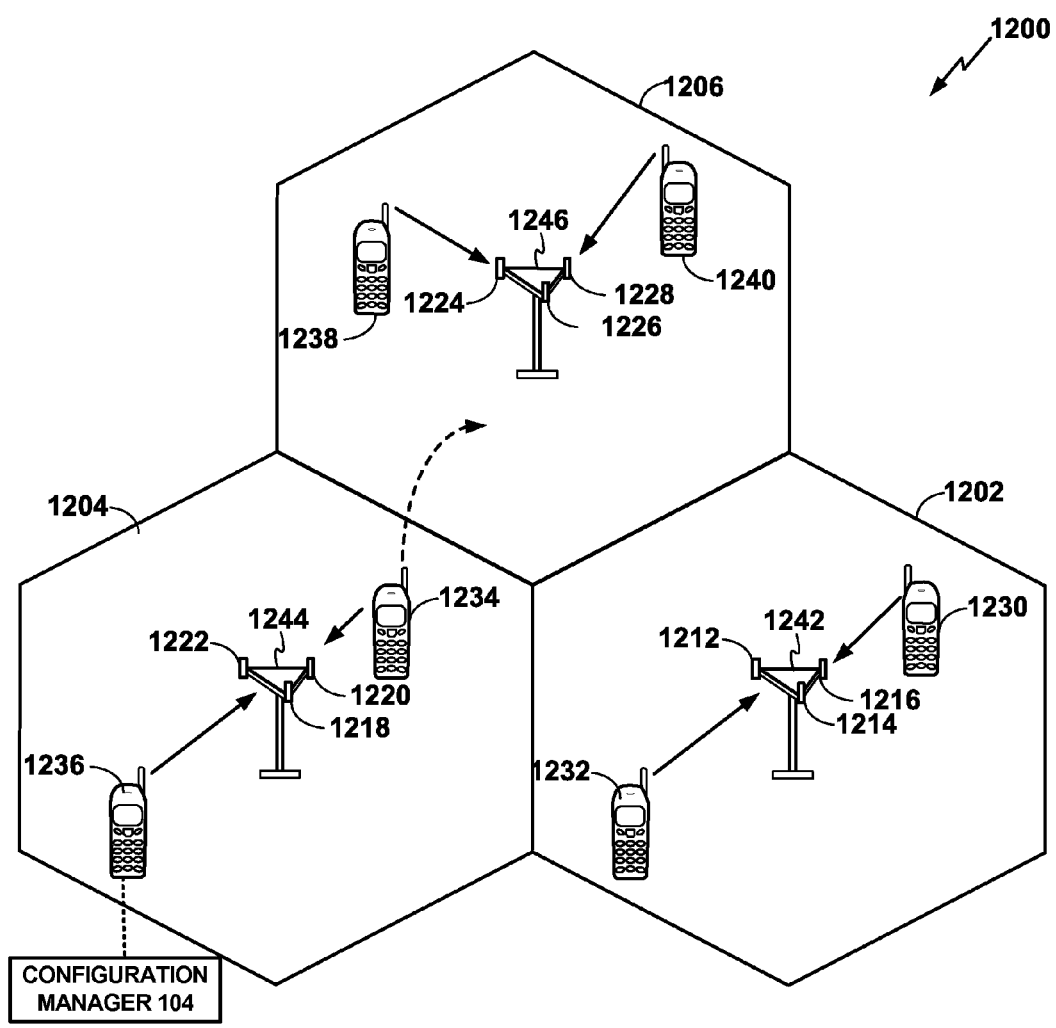
FIG. 12 is a conceptual diagram illustrating an example of an access network including a user equipment with a configuration manager according to the present disclosure.

Referring to FIG. 12, an access network 1200 in a UTRAN architecture is illustrated, and may include one or more UEs 1230, 1232, 1234, 1236, 1238, and 1240, which may be the same as or similar to UE 102 (FIG. 1) in that they are configured to include configuration manager 104 (FIGS. 1 and 9; for example, illustrated here as being associated with UE 1236) for reducing battery consumption during operation of a dedicated channel (DCH) at the UE. The multiple access wireless communication system includes multiple cellular regions (cells), including cells 1202, 1204, and 1206, each of which may include one or more sectors. The multiple sectors can be formed by groups of antennas with each antenna responsible for communication with UEs in a portion of the cell. For example, in cell 1202, antenna groups 1212, 1214, and 1216 may each correspond to a different sector. In cell 1204, antenna groups 1218, 1220, and 1222 each correspond to a different sector. In cell 1206, antenna groups 1224, 1226, and 1228 each correspond to a different sector. UEs, for example, 1230, 1232, etc. may include several wireless communication devices, e.g., User Equipment or UEs, including configuration manager 104 of FIG. 1, which may be in communication with one or more sectors of each cell 1202, 1204 or 12012. For example, UEs 1230 and 1232 may be in communication with Node B 1242, UEs 1234 and 1236 may be in communication with Node B 1244, and UEs 1238 and 1240 can be in communication with Node B 1246. Here, each Node B 1242, 1244, 1246 is configured to provide an access point to a CN 1104 (FIG. 11) for all the UEs 1230, 1232, 1234, 1236, 1238, 1240 in the respective cells 1202, 1204, and 1206. Additionally, each Node B 1242, 1244, 1246 may be base station 112 and/or and UEs 1230, 1232, 1234, 1236, 1238, 1240 may be UE 102 of FIG. 1 and may perform the methods outlined herein.

As the UE 1234 moves from the illustrated location in cell 1204 into cell 1206, a serving cell change (SCC) or handover may occur in which communication with the UE 1234 transitions from the cell 1204, which may be referred to as the source cell, to cell 1206, which may be referred to as the target cell. Management of the handover procedure may take place at the UE 1234, at the Node Bs corresponding to the respective cells, at a radio network controller 1106 (FIG. 11), or at another suitable node in the wireless network. For example, during a call with the source cell 1204, or at any other time, the UE 1234 may monitor various parameters of the source cell 1204 as well as various parameters of neighboring cells such as cells 1206 and 1202. Further, depending on the quality of these parameters, the UE 1234 may maintain communication with one or more of the neighboring cells. During this time, the UE 1234 may maintain an Active Set, that is, a list of cells that the UE 1234 is simultaneously connected to (i.e., the UTRA cells that are currently assigning a downlink dedicated physical channel DPCH or fractional downlink dedicated physical channel F-DPCH to the UE 1234 may constitute the Active Set). In any case, UE 1234 may perform the reselection operations described herein.

Further, the modulation and multiple access scheme employed by the access network 1200 may vary depending on the particular telecommunications standard being deployed. By way of example, the standard may include Evolution-Data Optimized (EV-DO) or Ultra Mobile Broadband (UMB). EV-DO and UMB are air interface standards promulgated by the 3rd Generation Partnership Project 2 (3GPP2) as part of the CDMA2000 family of standards and employs CDMA to provide broadband Internet access to mobile stations. The standard may alternately be Universal Terrestrial Radio Access (UTRA) employing Wideband-CDMA (W-CDMA) and other variants of CDMA, such as TD-SCDMA; Global System for Mobile Communications (GSM) employing TDMA; and Evolved UTRA (E-UTRA), Ultra Mobile Broadband (UMB), IEEE 1002.11 (Wi-Fi), IEEE 1002.16 (WiMAX), IEEE 1002.20, and Flash-OFDM employing OFDMA. UTRA, E-UTRA, UMTS, LTE, LTE Advanced, and GSM are described in documents from the 3GPP organization. CDMA2000 and UMB are described in documents from the 3GPP2 organization. The actual wireless communication standard and the multiple access technology employed will depend on the specific application and the overall design constraints imposed on the system.

Figure 13:
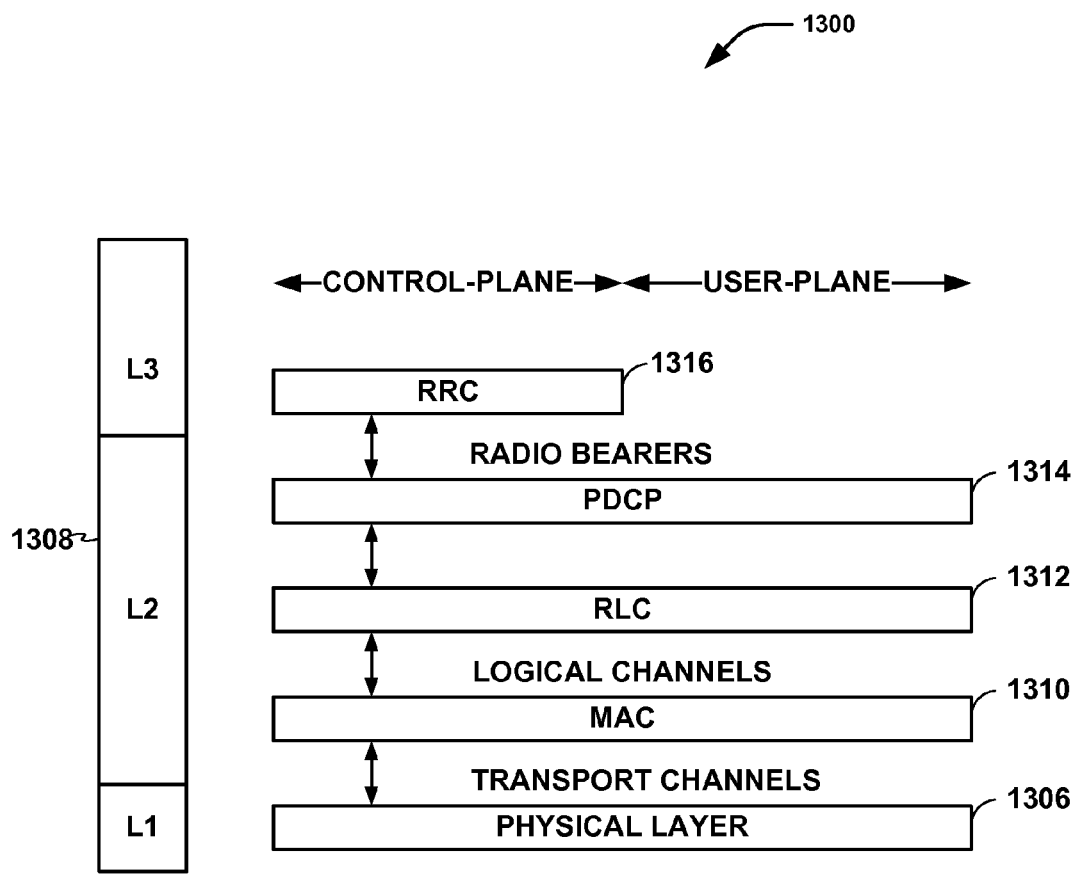
FIG. 13 is a conceptual diagram illustrating an example of a radio protocol architecture for the user and control plane that may be used by the user equipment of the present disclosure.

The radio protocol architecture may take on various forms depending on the particular application. An example for an HSPA system will now be presented with reference to FIG. 13. FIG. 13 is a conceptual diagram illustrating an example of the radio protocol architecture for the user and control planes.

Turning to FIG. 13, the radio protocol architecture for the UE, for example, UE 102 of FIG. 1 configured to include configuration manager 104 (FIGS. 1 and 9) for reducing battery consumption during operation of a dedicated channel (DCH) at a user equipment (UE) is shown with three layers: Layer 1 (L1), Layer 2 (L2), and Layer 3 (L3). Layer 1 is the lowest lower and implements various physical layer signal processing functions. Layer 1 (L1 layer) is referred to herein as the physical layer 1306. Layer 2 (L2 layer) 1308 is above the physical layer 1306 and is responsible for the link between the UE and Node B over the physical layer 1306.

In the user plane, L2 layer 1308 includes a media access control (MAC) sublayer 1310, a radio link control (RLC) sublayer 1312, and a packet data convergence protocol (PDCP) 1314 sublayer, which are terminated at the Node B on the network side. Although not shown, the UE may have several upper layers above L2 layer 1308 including a network layer (e.g., IP layer) that is terminated at a PDN gateway on the network side, and an application layer that is terminated at the other end of the connection (e.g., far end UE, server, etc.).

The PDCP sublayer 1314 provides multiplexing between different radio bearers and logical channels. The PDCP sublayer 1314 also provides header compression for upper layer data packets to reduce radio transmission overhead, security by ciphering the data packets, and handover support for UEs between Node Bs. The RLC sublayer 1312 provides segmentation and reassembly of upper layer data packets, retransmission of lost data packets, and reordering of data packets to compensate for out-of-order reception due to hybrid automatic repeat request (HARQ). The MAC sublayer 1310 provides multiplexing between logical and transport channels. The MAC sublayer 1310 is also responsible for allocating the various radio resources (e.g., resource blocks) in one cell among the UEs. The MAC sublayer 1310 is also responsible for HARQ operations.

Figure 14:
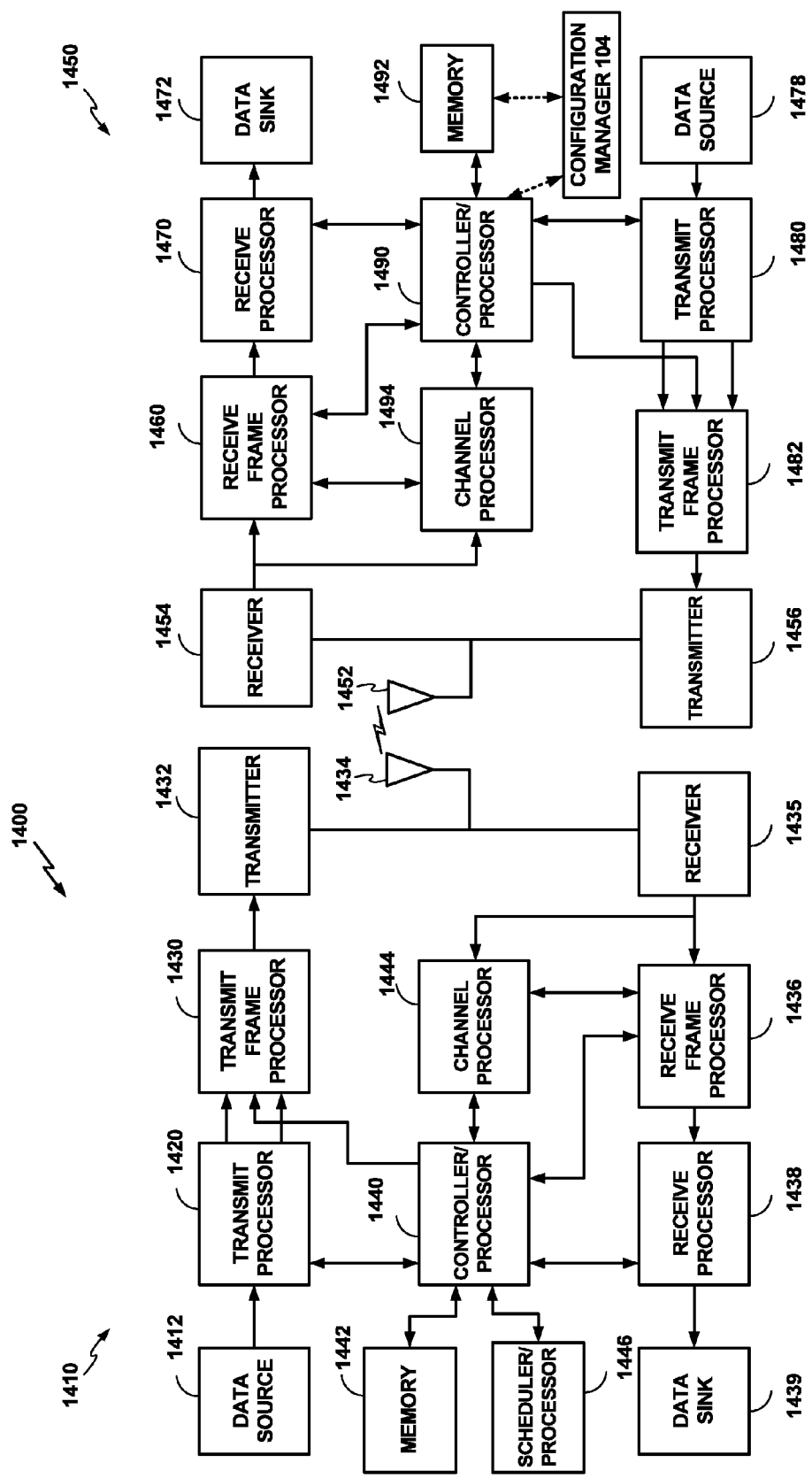
FIG. 14 is a block diagram conceptually illustrating an example of a Node B in communication with a UE, which includes a configuration manager according to the present disclosure, in a telecommunications system.

FIG. 14 is a block diagram of a Node B 1410 in communication with a UE 1450, where the Node B 1410 may be base station 112 of network entity 110 and/or the UE 1450 may be the same as or similar to UE 102 of FIG. 1 in that it is configured to include configuration manager 104 (FIGS. 1 and 9) for reducing battery consumption during operation of a dedicated channel (DCH) at the UE, in controller/processor 1490 and/or memory 1492. In the downlink communication, a transmit processor 1420 may receive data from a data source 1412 and control signals from a controller/processor 1440. The transmit processor 1420 provides various signal processing functions for the data and control signals, as well as reference signals (e.g., pilot signals). For example, the transmit processor 1420 may provide cyclic redundancy check (CRC) codes for error detection, coding and interleaving to facilitate forward error correction (FEC), mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM), and the like), spreading with orthogonal variable spreading factors (OVSF), and multiplying with scrambling codes to produce a series of symbols. Channel estimates from a channel processor 1444 may be used by a controller/processor 1440 to determine the coding, modulation, spreading, and/or scrambling schemes for the transmit processor 1420. These channel estimates may be derived from a reference signal transmitted by the UE 1450 or from feedback from the UE 1450. The symbols generated by the transmit processor 1420 are provided to a transmit frame processor 1430 to create a frame structure. The transmit frame processor 1430 creates this frame structure by multiplexing the symbols with information from the controller/processor 1440, resulting in a series of frames. The frames are then provided to a transmitter 1432, which provides various signal conditioning functions including amplifying, filtering, and modulating the frames onto a carrier for downlink transmission over the wireless medium through antenna 1434. The antenna 1434 may include one or more antennas, for example, including beam steering bidirectional adaptive antenna arrays or other similar beam technologies.

At UE 1450, a receiver 1454 receives the downlink transmission through an antenna 1452 and processes the transmission to recover the information modulated onto the carrier. The information recovered by the receiver 1454 is provided to a receive frame processor 1460, which parses each frame, and provides information from the frames to a channel processor 1494 and the data, control, and reference signals to a receive processor 1470. The receive processor 1470 then performs the inverse of the processing performed by the transmit processor 1420 in the Node B 1410. More specifically, the receive processor 1470 descrambles and de-spreads the symbols, and then determines the most likely signal constellation points transmitted by the Node B 1410 based on the modulation scheme. These soft decisions may be based on channel estimates computed by the channel processor 1494. The soft decisions are then decoded and de-interleaved to recover the data, control, and reference signals. The CRC codes are then checked to determine whether the frames were successfully decoded. The data carried by the successfully decoded frames will then be provided to a data sink 1472, which represents applications running in the UE 1450 and/or various user interfaces (e.g., display). Control signals carried by successfully decoded frames will be provided to a controller/processor 1490. When frames are unsuccessfully decoded by the receive processor 1470, the controller/processor 1490 may also use an acknowledgement (ACK) and/or negative acknowledgement (NACK) protocol to support retransmission requests for those frames.

In the uplink, data from a data source 1478 and control signals from the controller/processor 1490 are provided to a transmit processor 1480. The data source 1478 may represent applications running in the UE 1450 and various user interfaces (e.g., keyboard). Similar to the functionality described in connection with the downlink transmission by the Node B 1410, the transmit processor 1480 provides various signal processing functions including CRC codes, coding and interleaving to facilitate FEC, mapping to signal constellations, spreading with OVSFs, and scrambling to produce a series of symbols. Channel estimates, derived by the channel processor 1494 from a reference signal transmitted by the Node B 1410 or from feedback contained in the midamble transmitted by the Node B 1410, may be used to select the appropriate coding, modulation, spreading, and/or scrambling schemes. The symbols produced by the transmit processor 1480 will be provided to a transmit frame processor 1482 to create a frame structure. The transmit frame processor 1482 creates this frame structure by multiplexing the symbols with information from the controller/processor 1490, resulting in a series of frames. The frames are then provided to a transmitter 1456, which provides various signal conditioning functions including amplification, filtering, and modulating the frames onto a carrier for uplink transmission over the wireless medium through the antenna 1452.

The uplink transmission is processed at the Node B 1410 in a manner similar to that described in connection with the receiver function at the UE 1450. A receiver 1435 receives the uplink transmission through the antenna 1434 and processes the transmission to recover the information modulated onto the carrier. The information recovered by the receiver 1435 is provided to a receive frame processor 1436, which parses each frame, and provides information from the frames to the channel processor 1444 and the data, control, and reference signals to a receive processor 1438. The receive processor 1438 performs the inverse of the processing performed by the transmit processor 1480 in the UE 1450. The data and control signals carried by the successfully decoded frames may then be provided to a data sink 1439 and the controller/processor, respectively. If some of the frames were unsuccessfully decoded by the receive processor, the controller/processor 1440 may also use an acknowledgement (ACK) and/or negative acknowledgement (NACK) protocol to support retransmission requests for those frames.

The controller/processors 1440 and 1490 may be used to direct the operation at the Node B 1410 and the UE 1450, respectively. For example, the controller/processors 1440 and 1490 may provide various functions including timing, peripheral interfaces, voltage regulation, power management, and other control functions. The computer readable media of memories 1442 and 1492 may store data and software for the Node B 1410 and the UE 1450, respectively. A scheduler/processor 1446 at the Node B 1410 may be used to allocate resources to the UEs and schedule downlink and/or uplink transmissions for the UEs.

Several aspects of a telecommunications system have been presented with reference to a W-CDMA system. As those skilled in the art will readily appreciate, various aspects described throughout this disclosure may be extended to other telecommunication systems, network architectures and communication standards.

By way of example, various aspects may be extended to other UMTS systems such as TD-SCDMA, High Speed Downlink Packet Access (HSDPA), High Speed Uplink Packet Access (HSUPA), High Speed Packet Access Plus (HSPA+) and TD-CDMA. Various aspects may also be extended to systems employing Long Term Evolution (LTE) (in FDD, TDD, or both modes), LTE-Advanced (LTE-A) (in FDD, TDD, or both modes), CDMA2000, Evolution-Data Optimized (EV-DO), Ultra Mobile Broadband (UMB), IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

In accordance with various aspects of the disclosure, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., compact disk (CD), digital versatile disk (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may be resident in the processing system, external to the processing system, or distributed across multiple entities including the processing system. The computer-readable medium may be embodied in a computer-program product. By way of example, a computer-program product may include a computer-readable medium in packaging materials. Those skilled in the art will recognize how best to implement the described functionality presented throughout this disclosure depending on the particular application and the overall design constraints imposed on the overall system.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method for reducing battery consumption at a user equipment (UE), comprising:
   configuring a 10 ms transmission mode on an uplink (UL) channel at the UE;
   indicating configuration of the 10 ms transmission mode to a base station in communication with the UE;
   compressing a 20 ms transmission associated with a 20 ms transmission time interval (TTI) into a 10 ms compressed transmission;
   transmitting the 10 ms compressed transmission during a first 10 ms of the 20 ms TTI;
   performing a discontinuous transmission (DTX) of the UL channel during a second 10 ms of the 20 ms TTI;
   performing a decoding of a downlink (DL) dedicated physical channel (DPCH) at an early block error rate (BLER) target slot, the early BLER target slot is a time slot in the TTI with an associated target BLER value; and
   performing a discontinuous reception (DRX) at the UE during the second 10 ms of the 20 ms TTI in response to determining that the decoding of the DL DPCH is successful, wherein the decoding of the DL DPCH is determined to be successful when a decoding success rate of the DL DPCH meets the associated target BLER value.

2. The method of claim 1, wherein the DL DPCH is not received during the second 10 ms of the 20 ms TTI after an early BLER target at the base station is reached.

3. The method of claim 2, wherein the early BLER target is set to a value of 1% at slot 15.

4. The method of claim 1, further comprising:
   suspending transmission of transmit power control (TPC) commands to the base station during the second 10 ms of the 20 ms TTI.

5. The method of claim 1, wherein indicating the configuration of the 10 ms transmission mode to the base station comprises indicating via a transport format combination indicator (TFCI).

6. The method of claim 5, wherein a most significant bit (MSB) of the TFCI is used for indicating a TFCI value.

7. An apparatus for reducing battery consumption at a user equipment (UE), comprising:
   means for configuring a 10 ms transmission mode on an uplink (UL) channel at the UE;
   means for indicating configuration of the 10 ms transmission mode to a base station in communication with the UE;
   means for compressing a 20 ms transmission associated with a 20 ms transmission time interval (TTI) into a 10 ms compressed transmission;
   means for transmitting the 10 ms compressed transmission during a first 10 ms of the 20 ms TTI;
   means for performing a discontinuous transmission (DTX) of the UL channel during a second 10 ms of the 20 ms TTI;
   means for performing a decoding of a downlink (DL) dedicated physical channel (DPCH) at an early block error rate (BLER) target slot, the early BLER target slot is a time slot in the TTI with an associated target BLER value; and
   means for performing a discontinuous reception (DRX) at the UE during the second 10 ms of the 20 ms TTI in response to determining that the decoding of the DL DPCH is successful, wherein the decoding of the DL DPCH is determined to be successful when a decoding success rate of the DL DPCH meets the associated target BLER value.

8. The apparatus of claim 7, wherein the DL DPCH is not received during the second 10 ms of the 20 ms TTI after an early BLER target at the base station is reached.

9. The apparatus of claim 8, wherein the early BLER target is set to a value of 1% at slot 15.

10. The apparatus of claim 7, further comprising:
    means for suspending transmission of transmit power control (TPC) commands to the base station during the second 10 ms of the 20 ms TTI.

11. The apparatus of claim 7, wherein the means for indicating is further configured to indicate the configured transmission mode to the base station via a transport format combination indicator (TFCI).

12. The apparatus of claim 11, wherein a most significant bit (MSB) of the TFCI is used for indicating a TFCI value.

13. A non-transitory computer readable medium storing computer executable code for reducing battery consumption at a user equipment (UE), comprising:
    code for configuring a 10 ms transmission mode on an uplink (UL) channel at the UE;
    code for indicating configuration of the 10 ms transmission mode to a base station in communication with the UE;
    code for compressing a 20 ms transmission associated with a 20 ms transmission time interval (TTI) into a 10 ms compressed transmission;
    code for transmitting the 10 ms compressed transmission during a first 10 ms of the 20 ms TTI;
    code for performing a discontinuous transmission (DTX) of the UL channel during a second 10 ms of the 20 ms TTI;
    code for performing a decoding of a downlink (DL) dedicated physical channel (DPCH) at an early block error rate (BLER) target slot, the early BLER target slot is a time slot in the TTI with an associated target BLER value; and
    code for performing a discontinuous reception (DRX) at the UE during the second 10 ms of the 20 ms TTI in response to determining that the decoding of the DL DPCH is successful, wherein the decoding of the DL DPCH is determined to be successful when a decoding success rate of the DL DPCH meets the associated target BLER value.

14. The computer readable medium of claim 13, wherein the DL DPCH is not received during the second 10 ms of the 20 ms TTI after an early BLER target at the base station is reached.

15. The computer readable medium of claim 14, wherein the early BLER target is set to a value of 1% at slot 15.

16. The computer readable medium of claim 13, further comprising:

code for suspending transmission of transmit power control (TPC) commands to the base station during the second 10 ms of the 20 ms TTI.

17. The computer readable medium of claim 13, wherein the UE indicates the configured transmission mode to the base station via a transport format combination indicator (TFCI).

18. The computer readable medium of claim 17, wherein a most significant bit (MSB) of the TFCI is used for indicating a TFCI value.

19. An apparatus for reducing battery consumption at a user equipment (UE), comprising:
  a memory; and
  at least one processor coupled to the memory and configured to:
    configure a 10 ms transmission mode on an uplink (UL) channel at the UE;
    indicate configuration of the 10 ms transmission mode to a base station in communication with the UE;
    compress a 20 ms transmission associated with a 20 ms transmission time interval (TTI) into a 10 ms compressed transmission;
    transmit the 10 ms compressed transmission during a first 10 ms of the 20 ms TTI;
    perform a discontinuous transmission (DTX) of the UL channel during a second 10 ms of the 20 ms TTI;
    decode a downlink (DL) dedicated physical channel (DPCH) at an early block error rate (BLER) target slot, the early BLER target slot is a time slot in the TTI with an associated target BLER value; and
    perform a discontinuous reception (DRX) at the UE during the second 10 ms of the 20 ms TTI in response to determining that the decoding of the DL DPCH is successful, wherein the decoding of the DL DPCH is determined to be successful when a decoding success rate of the DL DPCH meets the associated target BLER value.

20. The apparatus of claim 19, wherein the DL DPCH is not received during the second 10 ms of the 20 ms TTI after an early BLER target at the base station is reached.

21. The apparatus of claim 20, wherein the early BLER target is set to a value of 1% at slot 15.

22. The apparatus of claim 19, wherein the at least one processor is further configured to:
  suspend transmission of transmit power control (TPC) commands to the base station during the second 10 ms of the 20 ms TTI.

23. The apparatus of claim 19, wherein the at least one processor is further configured to indicate the configured transmission mode to the base station via a transport format combination indicator (TFCI).

24. The apparatus of claim 23, wherein a most significant bit (MSB) of the TFCI is used for indicating a TFCI value.

* * * * *